(12) United States Patent
Ahn

(10) Patent No.: US 11,102,339 B2
(45) Date of Patent: Aug. 24, 2021

(54) DISPLAY DEVICE

(71) Applicant: Samsung Display Co., Ltd., Yongin-si (KR)

(72) Inventor: Sungsang Ahn, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/738,670

(22) Filed: Jan. 9, 2020

(65) Prior Publication Data

US 2020/0314225 A1    Oct. 1, 2020

(30) Foreign Application Priority Data

Mar. 29, 2019  (KR) .......................... 10-2019-0037270

(51) Int. Cl.
*H04M 1/02*   (2006.01)
*G06F 1/16*   (2006.01)
*H05K 5/02*   (2006.01)

(52) U.S. Cl.
CPC ........ *H04M 1/0268* (2013.01); *G06F 1/1601* (2013.01); *G06F 1/1637* (2013.01); *H05K 5/0217* (2013.01)

(58) Field of Classification Search
CPC .. H04M 1/0268; G06F 1/1601; G06F 1/1637; H05K 5/0217
See application file for complete search history.

(56) References Cited

U.S. PATENT DOCUMENTS

| 8,493,726 | B2 * | 7/2013 | Visser | ..................... G09F 9/301 |
| | | | | 361/679.3 |
| 10,684,714 | B2 * | 6/2020 | Seo | ........................ G06F 3/044 |
| 2004/0183958 | A1 * | 9/2004 | Akiyama | .................. G09F 9/30 |
| | | | | 349/58 |
| 2006/0176243 | A1 * | 8/2006 | Yeh | ..................... H04M 1/0268 |
| | | | | 345/30 |

(Continued)

FOREIGN PATENT DOCUMENTS

| CN | 102123187 B | 8/2014 |
| CN | 108230937 A | 6/2018 |

(Continued)

OTHER PUBLICATIONS

Extended European Search Report for corresponding European Patent Application No. 20165438.1, dated Jul. 29, 2020, 7 pages.

*Primary Examiner* — Rockshana D Chowdhury
(74) *Attorney, Agent, or Firm* — Lewis Roca Rothgerber Christie LLP

(57) ABSTRACT

A display device includes: a display module; a support part on a rear surface of the display module and comprising a support plate and a plurality of support bars; a first case accommodating the display module and the support part; a second case combined with the first case so as to be moved in a direction away from or close to the first case along a first direction; and a sub-support part under the support part so as to overlap a part of the support part, wherein both sides of the plurality of support bars are respectively inserted into first guide grooves defined in inner surfaces of the first case, which face with each other in a second direction crossing the first direction, and the plurality of support bars are configured to be moved along the first guide grooves.

19 Claims, 20 Drawing Sheets

(56) References Cited

U.S. PATENT DOCUMENTS

| | | | |
|---|---|---|---|
| 2012/0314400 A1* | 12/2012 | Bohn | G06F 1/1652 |
| | | | 362/97.1 |
| 2013/0058063 A1* | 3/2013 | O'Brien | G06F 1/1652 |
| | | | 361/807 |
| 2016/0081204 A1 | 3/2016 | Park et al. | |
| 2016/0100478 A1 | 4/2016 | Lee | |
| 2016/0202781 A1 | 7/2016 | Kim et al. | |
| 2018/0014417 A1 | 1/2018 | Seo et al. | |
| 2019/0297736 A1 | 9/2019 | Xu et al. | |

FOREIGN PATENT DOCUMENTS

| | | |
|---|---|---|
| KR | 10-2012-0038265 A | 4/2012 |
| KR | 10-2016-0031363 A | 3/2016 |
| KR | 10-2016-0141255 A | 12/2016 |
| KR | 10-2017-0116551 A | 10/2017 |
| KR | 10-2018-0039027 A | 4/2018 |

* cited by examiner

DISPLAY DEVICE

CROSS-REFERENCE TO RELATED APPLICATIONS

This application claims priority to and the benefit of Korean Patent Application No. 10-2019-0037270, filed on Mar. 29, 2019, the entire contents of which are hereby incorporated by reference.

BACKGROUND

Aspects of some example embodiments of the present disclosure herein relate to a display device.

An electronic device, such as a smartphone, a digital camera, a notebook computer, a navigation device, or a smart TV, which provides an image to a user, includes a display device for displaying the image. The display device generates an image and provides the image to a user through a display screen.

Recently, various types of display devices are being developed with the development of display device technology. For example, a flexible display device or the like, which may be folded or wound, is being developed. A flexible display device of which shape may be modified in various ways is easily portable, and thus may improve user's convenience.

The flexible display device includes a flexible display module. The display module may be accommodated in a case, and if necessary, may be drawn therefrom and extend to the outside thereof. A support part may be positioned under the display module to support the display module. However, the support part may be modified, when an external force is applied thereto.

The above information disclosed in this Background section is only for enhancement of understanding of the background and therefore the information discussed in this Background section does not necessarily constitute prior art.

SUMMARY

Aspects of some example embodiments of the present disclosure herein relate to a display device, and for example, to a display device capable of preventing modification of support bars that support a display module.

Aspects of some example embodiments of the present disclosure include a display device that may be capable of preventing modification of support bars that support a display module.

Aspects of some example embodiments of the inventive concept include a display device including: a display module; a support part on a rear surface of the display module and including a support plate and a plurality of support bars; a first case accommodating the display module and the support part; a second case combined with the first case so as to be moved in a direction away from or close to the first case along a first direction; and a sub-support part under the support part so as to overlap a part of the support part, wherein both sides of the plurality of support bars are respectively inserted into first guide grooves defined in inner surfaces of the first case, which face with each other in a second direction crossing the first direction, and the plurality of support bars are configured to be moved along the first guide grooves.

According to some example embodiments, the sub-support part is adjacent to one of both sides of the first case, which are opposite to each other in the first direction.

According to some example embodiments, when the second case is moved in a direction away from the first case, the plurality of support bars are moved to be on the sub-support part.

According to some example embodiments, each of the first guide grooves include: a first extension part extending in the first direction; a second extension part extending in the first direction and positioned under the first extension part; and a curved part extending from one side of the first extension part to one side of the second extension part, wherein the one side of each of the first and second extension parts is adjacent to the one side of the first case, and the curved part has a convexly curved shape toward the one side of the first case.

According to some example embodiments, the sub-support part is between the first extension part and the second extension part.

According to some example embodiments, the sub-support part is adjacent to the first extension part and the curved part.

According to some example embodiments, the support plate is connected to the second case, both sides of the support plate are configured to be inserted respectively into the first extension parts, when the second case is moved in a direction close to the first case, and the both sides of the plurality of support bars are configured to be inserted into the curved parts and the second extension parts.

According to some example embodiments, the plurality of support bars extend in the second direction, and are separated from each other to be arrayed in the first direction.

According to some example embodiments, the second case is moved in the first direction, a part of the plurality of support bars are moved along the curved parts to be in a portion of the first extension parts, which is adjacent to the curved parts, and the sub-support part is under the support bars in the portion of the first extension parts, which is adjacent to the curved parts.

According to some example embodiments, the display device further includes: a gear part in the first case, extending in the second direction, and between the first extension parts and the second extension parts to be adjacent to the curved parts, wherein teeth of the gear part are between support bars in the curved parts among the plurality of support bars.

According to some example embodiments, the gear part is configured to be rotated to move the support bars in the curved parts.

According to some example embodiments, the gear part is between the sub-support part and the curved parts.

According to some example embodiments, the support plate includes: a first support plate connected to the second case; and a second support plate between the first support plate and the plurality of support bars, wherein both sides of the second support plate are inserted into the first extension parts.

According to some example embodiments, the first support plate has a longer length than the second support plate on a basis of the second direction.

According to some example embodiments, both sides of the first support plate are respectively inserted into connection grooves defined in inner surfaces of the second case, which face each other in the second direction, and the connection grooves do not overlap the first extension parts, when viewed in the second direction.

According to some example embodiments, the first case includes: a first sidewall extending in the first direction; a second sidewall extending in the first direction and facing the first sidewall in the second direction; a third sidewall between one side of the first sidewall and one side of the second sidewall, and defining the one side of the first case; and a first bottom part connected to bottom ends of the first, second, and third sidewalls.

According to some example embodiments, the first guide grooves are respectively defined in inner surfaces of the first sidewall and the second sidewall, which face each other, and the sub-support part is between the first and second sidewalls and adjacent to the third sidewall.

According to some example embodiments, the second case includes: a first outer sidewall on an outer surface of the first sidewall; a second outer sidewall on an outer surface of the second sidewall; a third outer sidewall facing the third sidewall, and between the first outer sidewall and the second sidewall; and a second bottom part under the first bottom part.

According to some example embodiments, the second case further includes first protruding parts respectively protruding from inner surfaces of the first outer sidewall and the second outer sidewall to extend in the first direction, wherein the first protruding parts are inserted into second guide grooves respectively defined in outer surfaces of the first sidewall and the second sidewall to extend in the first direction.

According to some example embodiments, the second case further includes second protruding parts respectively protruding from top ends of the first outer sidewall and the second outer sidewall toward the first sidewall and the second sidewall and extending in the first direction, wherein the second protruding parts are inserted into third guide grooves respectively defined in top ends of the first sidewall and the second sidewall to extend in the first direction.

BRIEF DESCRIPTION OF THE FIGURES

The accompanying drawings are included to provide a further understanding of the inventive concept, and are incorporated in and constitute a part of this specification. The drawings illustrate aspects of some example embodiments of the inventive concept and, together with the description, serve to explain principles of the inventive concept. In the drawings.

DETAILED DESCRIPTION

Figure 1:
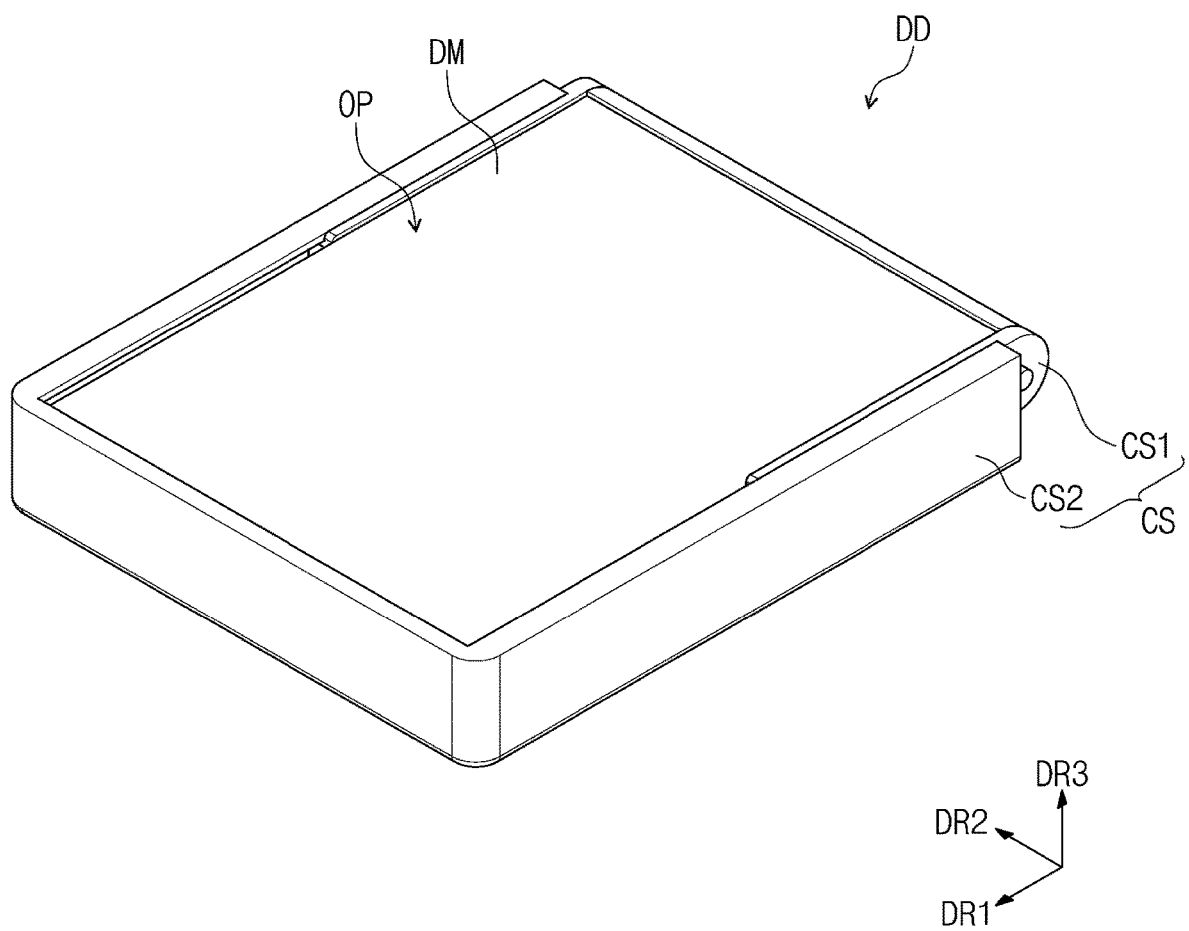
FIG. 1 is a perspective view of a display device according to some example embodiments of the inventive concept.

It will be understood that when an element or layer is referred to as being "on", "connected to" or "coupled to" another element or layer, it can be directly on, connected or coupled to the other element or intervening third elements may be present.

Like reference numerals in the drawings refer to like elements. In addition, in the drawings, the thickness and the ratio and the dimension of the element are exaggerated for effective description of the technical contents.

The term "and/or" includes any and all combinations of one or more of the associated items.

Terms such as first, second, and the like may be used to describe various components, but these components should not be limited by the terms. The terms are used only for the purpose of distinguishing one component from another component. For instance, a first component may be referred to as a second component, or similarly, a second component may be referred to as a first component, without departing from the scope of the present disclosure. The singular forms "a," "an" and "the" are intended to include the plural forms as well, unless the context clearly indicates otherwise.

In addition, the terms such as "under", "lower", "on", and "upper" are used for explaining associations of items illustrated in the drawings. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

Hereinafter, aspects of some example embodiments of the present disclosure will be described in more detail with reference to the accompanying drawings.

Figure 2:
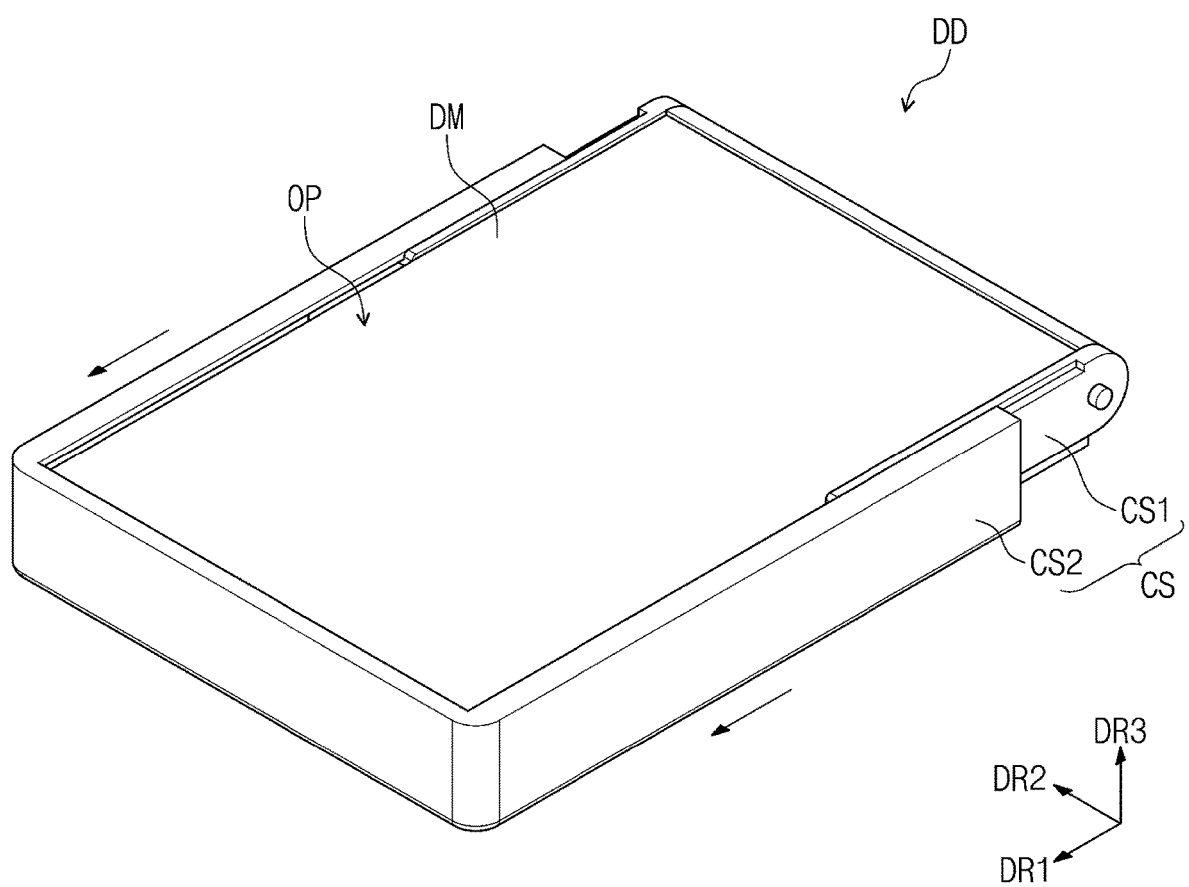
FIG. 2 is a drawing for explaining an extension mode of the display device illustrated in FIG. 1.

FIG. 1 is a perspective view of a display device according to some example embodiments of the inventive concept. FIG. 2 is a drawing for explaining an extension mode of the display device illustrated in FIG. 1.

Referring to FIG. 1, a display device DD according to some example embodiments of the inventive concept may include a display module DM and a case CS in which the display module DM is accommodated or positioned. The display module DM may be exposed to the outside through an opening part OP defined in an upper part of the case CS.

The case CS may include a first case CS1 and a second case CS2 that are mutually combined to accommodate (i.e., partially enclose or house) the display module DM. The second case CS2 may be combined to the first case CS1 so as to be moved in a first direction DR1.

Hereinafter, a direction crossing the first direction DR1 is defined as a second direction DR2. A direction substantially perpendicularly crossing the plane defined by the first and second directions DR1 and DR2 is defined as a third direction DR3. In the present specification, "when viewed in a plan view" may mean a state of being viewed in the third direction.

Figure 7:
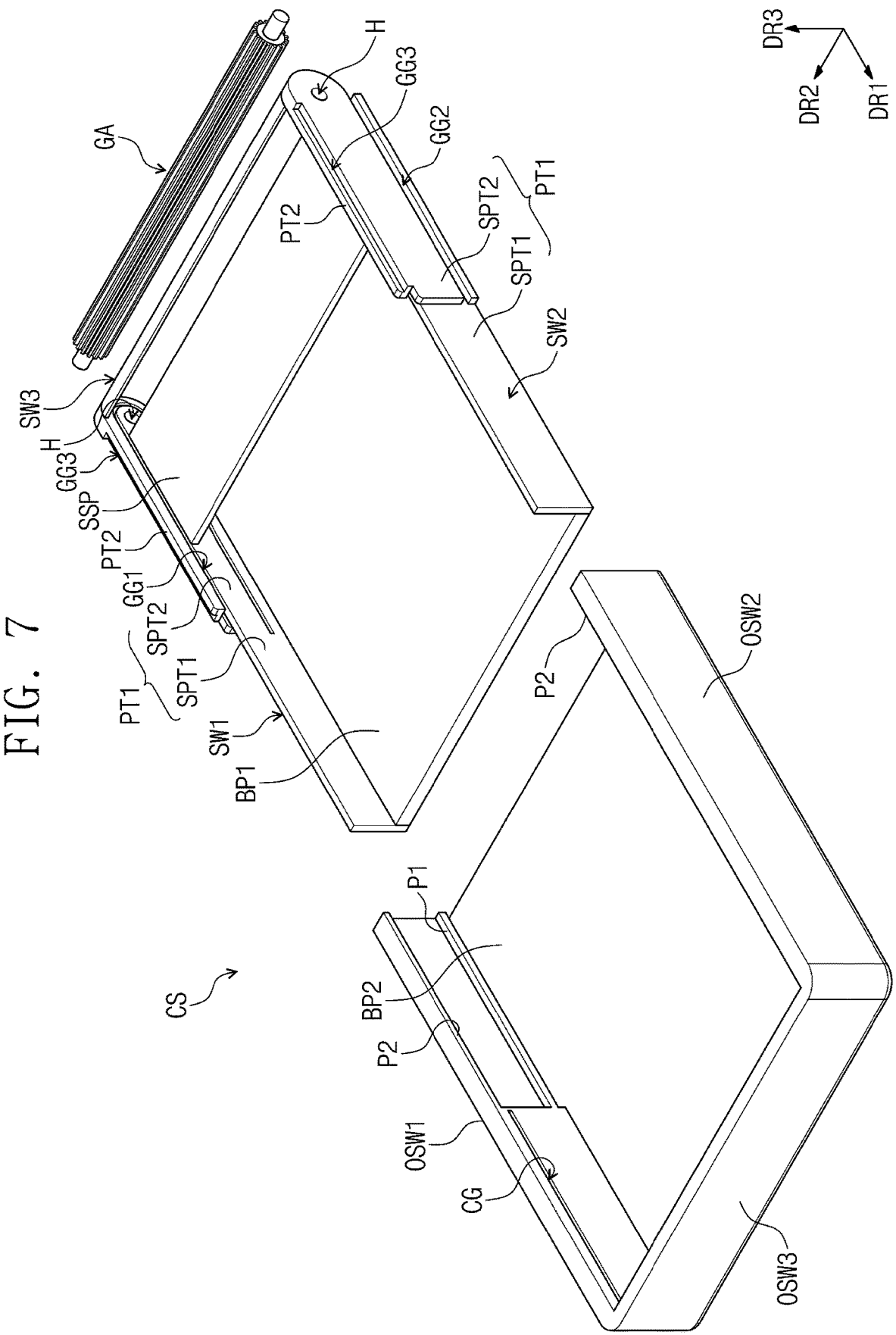
FIG. 7 is an exploded perspective view of a case illustrated in FIG. 1.

Detailed descriptions about the first and second cases CS1 and CS2 will be provided with reference to an exploded perspective view of the case CS illustrated in FIG. 7.

Referring to FIGS. 1 and 2, the second case CS2 may be moved along the first direction DR1 away from or close to the first case CS1. When the second case CS2 is moved in the first direction DR1, the area of an exposed surface of the display module DM may be adjusted according to the movement of the second case CS2. According to the movement of the second case CS2, both a fundamental mode and an extension mode of the display device DD may be realized.

For example, the display module DM may be a flexible display module, and may be supported by a support part (illustrated below in FIG. 13) positioned under the display module DM. The support part may be connected to the second case CS2, and when the second case CS2 is moved in a direction away from the first case CS1 along the first direction DR1, the support part may be moved away from the first case CS1 in the first direction DR1.

According to some example embodiments, other than a part of the display module DM which is exposed through the opening part OP, a part of the display module DM which is not exposed to the outside may be positioned in the first case CS1. The display module DR1 positioned on the support part is moved with the support part in the first direction DR1 according to the movement of the second case CS2, and as a result, an exposure surface of the display module DM may extend. As the exposure surface of the display module DM extends, a user may view an image through a larger screen. A state of the display device DD in which the exposure surface of the display module DM extends may be defined as the extension mode.

As illustrated in FIG. 1, in a state where the first case CS1 and the second case CS2 are combined to be adjacent to each other, the exposure surface of the display module DM may be set minimum. For example, as the second case CS2 is moved in a direction close to the first case CS along the first direction DR1, the first case CS1 and the second case may be positioned adjacent to each other as illustrated in FIG. 1. Such a state of the display device DD may be defined as the fundamental mode.

Figure 3:
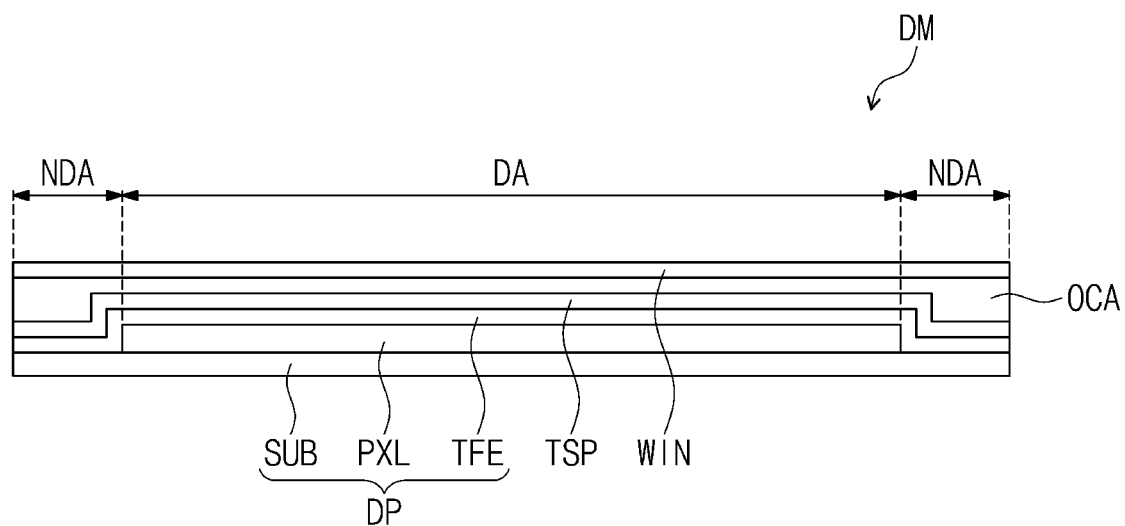
FIG. 3 schematically illustrates a cross section of a display module shown in FIG. 1.

FIG. 3 schematically illustrates a cross section of the display module shown in FIG. 1.

Referring to FIG. 3, the display module DM may include a display panel DP, a touch sensing part TSP positioned on the display panel DP, a window WIN positioned on the touch sensing part TSP, and an adhesive OCA positioned between the touch sensing part TSP and the window WIN.

The display panel DP according to some example embodiments of the inventive concept may be an emissive display panel. However, the embodiments of the inventive concept are not limited thereto, and various display panels including a liquid crystal display panel, an electrowetting panel, an electrophoretic panel, or the like, which may display an image, may be used as the display panel DP. The display panel DP may be a flexible display panel.

The display panel DP according to some example embodiments of the inventive concept may be an emissive display panel, and is not particularly limited. For example, the display panel DP may be an organic light emitting display panel or a quantum dot light emitting display panel. A light emitting layer of the organic light emitting display panel includes an organic light emitting material. A light emitting layer of the quantum dot light emitting display panel may include a quantum dot and a quantum rod. Hereinafter, the display panel DP will be described as the organic light emitting display panel.

The display panel DP may include a substrate SUB, a pixel layer PXL positioned on the substrate SUB, and a thin film encapsulation layer TFE positioned on the substrate SUB so as to cover the pixel layer PXL. The substrate SUB may include a flexible plastic substrate as a transparent substrate. For example, the substrate SUB may include polyimide.

The substrate SUB may include a display area DA and a non-display area around the display area DA. The pixel layer PXL may be positioned on the display area DA. The pixel layer PXL may include a plurality of pixels, and each pixel may include a light emitting element.

The thin film encapsulation layer TFE may include at least two inorganic layers and an organic layer positioned therebetween. The inorganic layers may include an inorganic material to protect the pixel layer PXL from moisture/oxygen. The organic layer may include an organic material to protect the pixel layer PXL from a foreign material such as a dust particle.

The touch sensing part TSP may be positioned on the thin-film encapsulation layer TFE. The touch sensing part TSP may sense an external input (a finger of the user, a touch pen, or the like) to change the sensed signal into a prescribed input signal. The touch sensing part TSP may include a plurality of sensing electrodes for sensing the external input. The sensing electrodes may sense an external input in a static capacitive manner.

The touch sensing part TSP may be directly manufactured on the thin-film encapsulation layer TFE at the time of manufacturing the display module DM. However, the embodiments of the inventive concept are not limited thereto, and the touch sensing part TSP may be manufactured as a touch panel separately from the display panel DP, and may be attached to the display panel DP by means of the adhesive.

The window WIN may protect the display panel DP and the touch sensing part TSP from an external scratch or shock. The window WIN may be attached to the touch sensing part TSP by means of the adhesive OCA. The adhesive OCA may include an optical clear adhesive. An image generated in the display panel DP may pass through the window WIN to be provided for the user.

Figure 4:
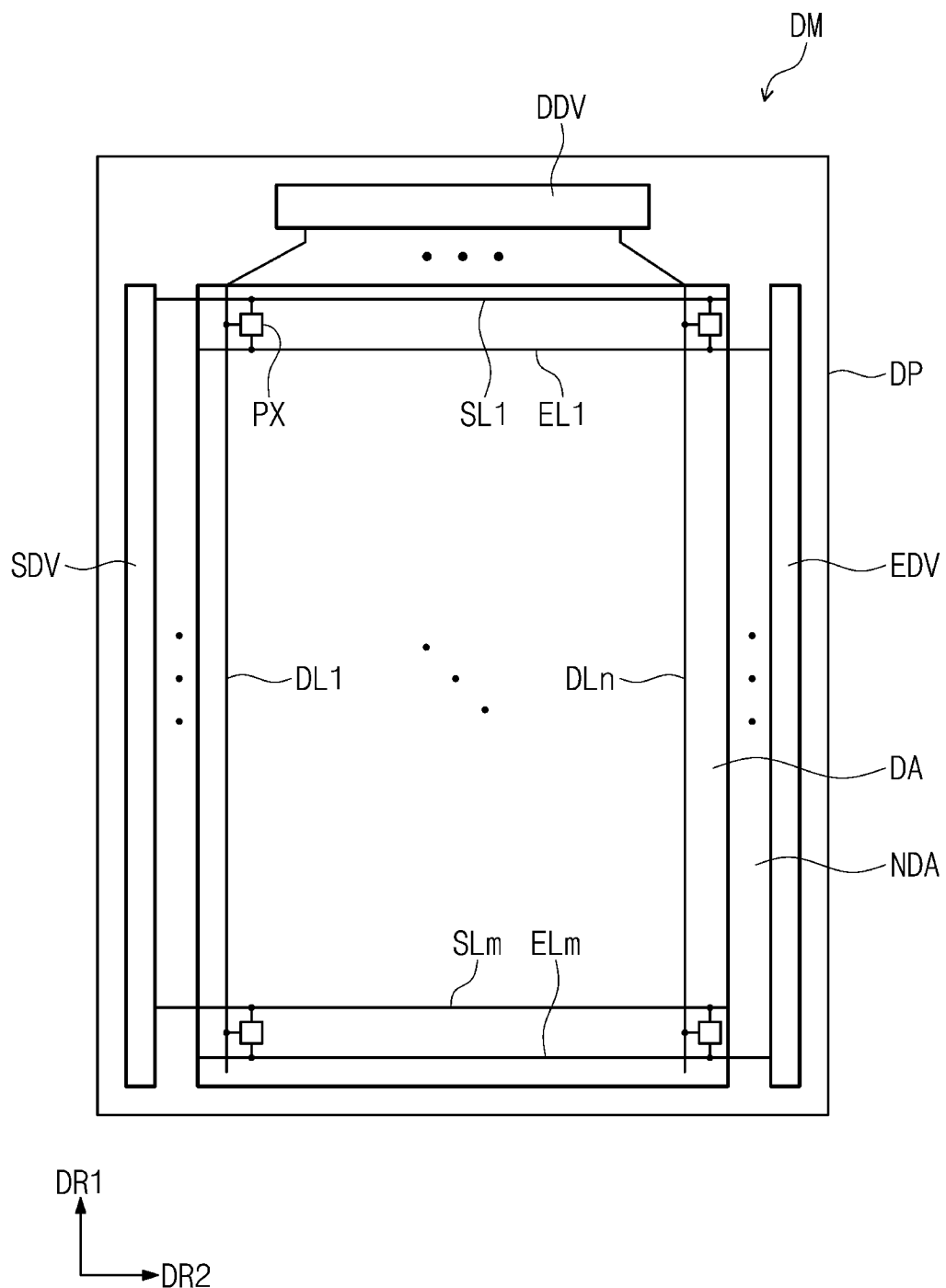
FIG. 4 is a plan view of a display module shown in FIG. 3.

FIG. 4 is a plan view of the display module shown in FIG. 3.

Referring to FIG. 4, the display module DM may include a display panel DP, a scan driver SDV, a data driver DDV, and an emission driver EDV. An example planar configuration of the display panel DP is illustrated in FIG. 4, and a planar configuration of the touch sensing part TSP is omitted.

The display panel DP may have a rectangular shape with long sides in the first direction DR1 and short sides in the second direction DR2. The display panel DP may have a plane defined by the first and second directions DR1 and DR2. The display panel DP may include a display area DA and a non-display area surrounding the display area DA.

The display panel DP may include a plurality of pixels PX, a plurality of scan lines SL1 to SLm, a plurality of data lines DL1 to DLn, and a plurality of emission lines EL1 to ELm. Here, m and n are natural numbers. The pixels PX may be positioned on the display area DA, and connected to the scan lines SL1 to SLm, the data lines DL1 to DLn, and emission lines EL1 to ELm The scan driver SDV, the data driver DDV, and the emission driver EDV may be positioned in the non-display area. The scan driver SDV may be positioned in the non-display area NDA adjacent to one side of the display panel DP, which is defined as any one of the long sides of the display panel DP.

The emission driver EDV may be positioned in the non-display area NDA adjacent to the other side of the display panel DP, which is defined as an opposite side to the one side of the display panel DP. The data driver DDV may be manufactured in an integrated circuit chip type to be positioned in the non-display area NDA adjacent to any one of the short sides of the display panel DP.

The scan lines SL1 to SLm may extend in the second direction DR2 to be connected to the scan driver SDV. The data lines DL1 to DLn may extend in the first direction DR1 to be connected to the data driver DDV. The emission lines EL1 to Elm may extend in the second direction DR2 to be connected to the emission driver EDV.

The scan driver SDV may generate a plurality of scan signals, and the scan signals may be applied to the pixels PX through the scan lines SL1 to SLm. The scan signals may be sequentially applied to the pixels PX. The data driver DDV may generate a plurality of data voltages, and the data voltages may be applied to the pixels PX through the data lines DL1 to DLn. The emission driver EDV may generate a plurality of emission signals and the emission signals may be applied to the pixels PX through the emission lines EL1 to Elm.

According to some example embodiments, the display module DM may include a timing controller for controlling operations of the scan driver SDV, the data driver DDV, and the emission driver EDV.

The timing controller may generate a scan control signal, a data control signal, and an emission control signal in response to control signals received from the outside. The timing controller may receive image signals from the outside, convert the data format of the image signals in order to be matched with the specification of an interface with the data driver DDV, and provide the converted signals to the data driver DDV.

The scan driver SDV may generate the scan signals in response to the scan control signal, and the emission driver EDV may generate the emission signals in response to the emission control signal. The data driver DDV may receive the image signals of which data format has been converted, and generate data voltages corresponding to the image signals in response to the data control signal.

The pixels PX may receive data voltages in response to the scan signals. The pixels PX may display an image by emitting light having the luminance corresponding to the data voltages in response to the emission signals. An emission time of the pixels PX may be controlled by the emission signals.

Figure 5:
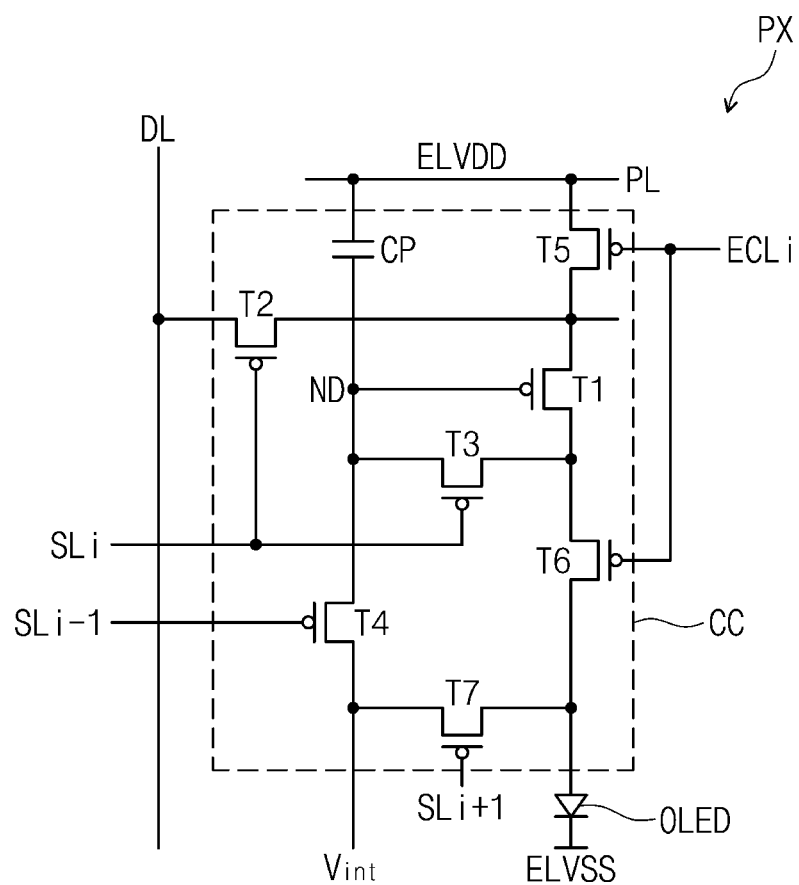
FIG. 5 illustrates an example equivalent circuit of any one pixel shown in FIG. 4.

FIG. 5 illustrates an example equivalent circuit of any one pixel shown in FIG. 4.

Referring to FIG. 5, a pixel PX may include an organic light emitting element OLED and a pixel circuit CC. The pixel circuit CC may include a plurality of transistors T1 to T7, and a capacitor CP. The pixel circuit CC may control an amount of a current flowing through the organic light emitting device OLED in correspondence to the data voltage.

The organic light emitting diode OLED may emit light at a prescribed luminance in correspondence to the current amount provided from the pixel circuit CC. To this end, the level of a first voltage ELVDD may be set higher than that of a second voltage ELVSS.

Each of the transistors T1 to T7 may include an input electrode (or a source electrode), an output electrode (or a drain electrode), and a control electrode (or a gate electrode). In the present specification, any one among the input electrode and the output electrode is referred to as a first electrode, and the other is referred to as a second electrode.

The first electrode of the first transistor T1 is connected to the first power source ELVDD via the fifth transistor T5, and the second electrode is connected to an anode electrode of the organic light emitting device OLED via the sixth transistor T6. The first transistor T1 may be referred to as a driving transistor in the present specification. The first transistor T1 controls the amount of the current flowing through the organic light emitting element OLED according to a voltage applied to the control electrode of the first transistor T1.

The second transistor T2 may be connected between a data line DL and a first electrode of the first transistor T1, and a control electrode of the second transistor T2 may be connected to an i-th scan line SLi. The second transistor T2 may be turned on when the i-th scan signal Si is provided to the i-th scan line SLi, to thereby electrically connect the data line DL and the first electrode of the first transistor T1.

The third transistor T3 may be connected between the second electrode and the control electrode of the first transistor T1. The control electrode of the third transistor T3 may be connected to the i-th scan line SLi. The third transistor T3 may be turned on when the i-th scan signal Si is provided to the i-th scan line SLi, to thereby electrically connect the second electrode and the control electrode of the first transistor T1. When the third transistor T3 is turned on, the first transistor T1 may be connected in a diode type.

The fourth transistor T4 may be connected between a node ND and an initialization power generation part. The control electrode of the fourth transistor T4 may be connected to the (i−1)-th scan line SLi−1. The fourth transistor T4 may be turned on when an (i−1)-th scan signal Si−1 is provided to the (i−1)-th scan line SLi−1 to thereby provide an initialization voltage Vint to the node ND.

The fifth transistor T5 may be connected between the power line PL and the first electrode of the first transistor T1. The control electrode of the third transistor T5 may be connected to the i-th emission line ELi.

The sixth transistor T6 may be connected between the second electrode of the first transistor T1 and the anode electrode of the organic light emitting element OLED. The control electrode of the sixth transistor T6 may be connected to the i-th emission line ELi.

The seventh transistor T7 may be connected between the initialization power generation part and the anode electrode of the organic light emitting element OLED. The control electrode of the seventh transistor T7 may be connected to an (i+1)-th scan line SLi+1. The seventh transistor T7 may be turned on when an (i+1)-th scan signal Si+1 is provided to the (i+1)-th scan line SLi+1 to thereby provide the initialization voltage Vint to the anode electrode of the organic light emitting device OLED.

The seventh transistor T7 may improve black level representation capability of the pixel PX. For example, when the seventh transistor T7 is turned on, a parasite capacitor of the organic light emitting element OLED may be discharged. In this case, at the time of implementing black luminance, the organic light emitting element OLED may not emit light due to a leakage current from the first transistor T1, and thereby improve the black level representation capability.

In FIG. 5, the control electrode of the seventh transistor T7 is illustrated as being connected to the (i+1)-th scan line SLi+1, but the embodiments of the inventive concept are not limited thereto. According to some example embodiments of the inventive concept, the control electrode of the seventh transistor T7 may be connected to the i-th scan line SLi or the (i−1)-th scan line SLi−1.

Even though FIG. 5 is illustrated on the basis of a PMOS transistor, the inventive concept is not limited thereto. According to some example embodiments of the inventive concept, the pixel PX may be configured with an NMOS transistor. According to some example embodiments of the inventive concept, the pixel PX may be configured with a combination of an NMOS and a PMOS.

A capacitor CP may be positioned between the power line PL and the node ND. The capacitor may store a data voltage. When the fifth transistor T5 and the sixth transistor T6 are turned on according to the voltage stored in the capacitor CP, the amount of the current flowing through the first transistor T1 may be determined.

The structure of the pixel PX according to some example embodiments of the inventive concept is not limited to that illustrated in FIG. 5. According to some example embodiments the inventive concept, the pixel PX may be implemented in various types in order to cause the organic light emitting element OLED to emit light.

Figure 6:
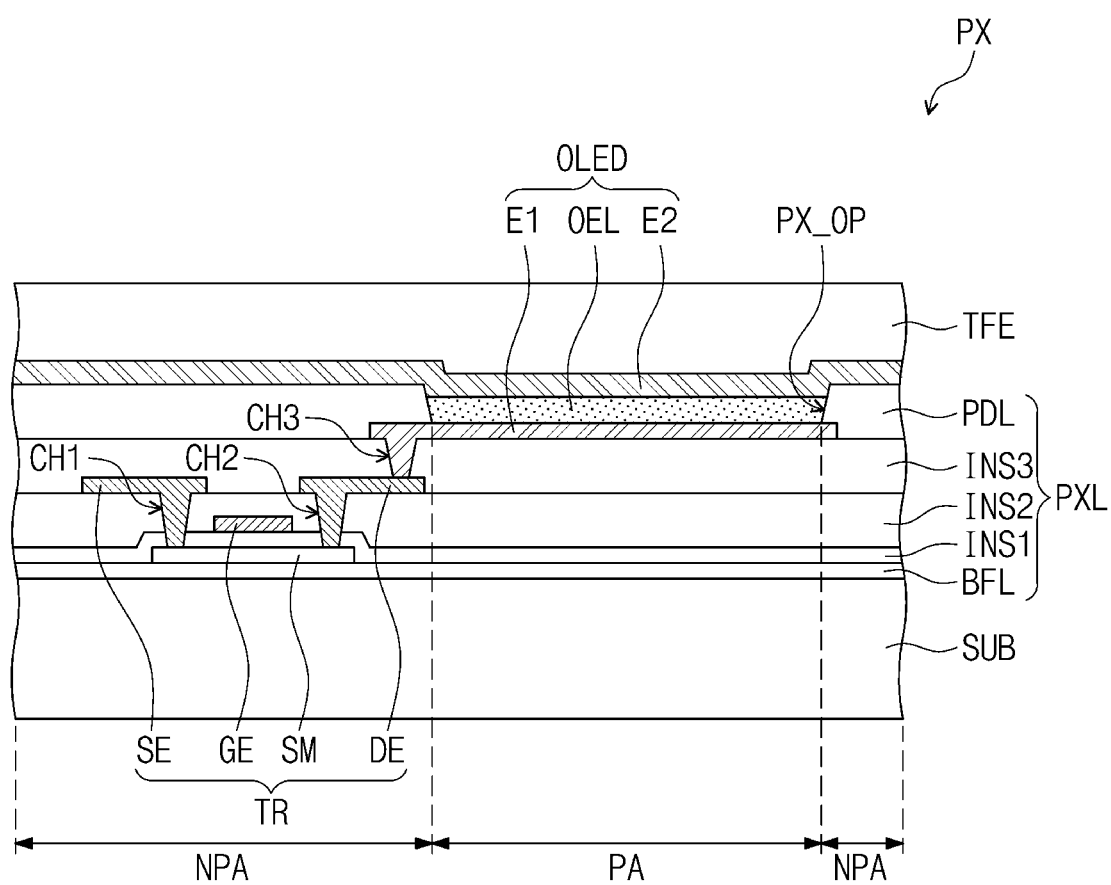
FIG. 6 illustrates a cross section of a part corresponding to a light emitting element shown in FIG. 5.

FIG. 6 illustrates a cross section of a part corresponding to the light emitting element shown in FIG. 5.

Referring to FIG. 6, the pixel PX may include an organic light emitting element OLED and a transistor TR connected thereto. The organic light emitting element OLED may include a first electrode E1, a second electrode E2, and an organic emission layer OEL positioned between the first electrode E1 and the second electrode E2. The transistor TR may be the sixth transistor T6 illustrated in FIG. 5. The first electrode E1 may be an anode, and the second electrode E2 may be a cathode.

The pixel PX may be divided into a pixel area PA and a non-pixel area NPA around the pixel area PA. The organic light emitting element OLED may be positioned in the pixel area PA, and the transistor TR may be positioned in the non-pixel area NPA.

The transistor TR and the organic light emitting element OLED may be positioned on the substrate SUB. A buffer layer BFL may be positioned on the substrate SUB, and include an inorganic material. A semiconductor layer SM of the transistor TR may be positioned on the buffer layer BFL. The semiconductor layer SM may include an inorganic semiconductor such as amorphous silicon or polysilicon, or an organic semiconductor. In addition, the semiconductor layer SM may include an oxide semiconductor.

According to some example embodiments, the semiconductor layer SM may include a source region, a drain region, and a channel region between the source region and the drain region.

A first insulation layer INS1 may be positioned on the buffer layer BFL so as to cover the semiconductor layer SM. The first insulation layer INS1 may include an inorganic material. The gate electrode GE of the transistor TR, which overlaps the semiconductor layer SM, may be positioned on the first insulation layer INS1. The gate electrode GE may be positioned to overlap the channel region of the semiconductor layer SM.

A second insulation layer INS2 may be positioned on the first insulation layer INS1 so as to cover the gate electrode GE. The second insulation layer INS2 may be defined as an interlayer insulation layer. The second insulation layer INS2 may include an organic material and/or inorganic material.

A source electrode SE and a drain electrode DE of the transistor TR may be separately positioned on the second insulation layer INS2. The source electrode SE may be connected to the source region of the semiconductor layer SM through a first contact hole CH1 defined by penetrating through the first insulation layer INS1 and the second insulation layer INS2. The drain electrode DE may be connected to the drain region of the semiconductor layer SM through a second contact hole CH2 defined by penetrating through the first insulation layer INS1 and the second insulation layer INS2.

A third insulation layer INS3 may be positioned on the second insulation layer INS2 so as to cover the source electrode SE and the drain electrode DE of the transistor TR. The third insulation layer INS3 may be defined as a planarization layer that provides a flat top surface, and may include an organic material.

A first electrode E1 may be positioned on the third insulation layer INS3. The first electrode E1 may be connected to the drain electrode DE of the transistor TR through a third contact hole CH3 defined by penetrating through the third insulation layer INS3. The first electrode E1 may be defined as a pixel electrode.

A pixel definition layer PDL exposing a prescribed part of the first electrode E1 may be positioned on the first electrode E1 and the third insulation layer INS3. In the pixel definition layer PDL, an opening part PX_OP may be defined to expose the prescribed portion of the first electrode E1.

The organic electrode layer OEL may be positioned on the first electrode E1 in the opening part PX_OP. The organic emission layer OEL may generate light of one among red, green, and blue colors. However, the embodiments of the inventive concept are not limited thereto, and the organic emission layer OEL may also generate white light by combining organic materials that generate red, green, and blue colors.

A second electrode E2 may be positioned on the pixel definition layer PDL and the organic light emitting layer OEL. The second electrode E2 may be defined as a common electrode.

The thin film encapsulation layer TFE may be positioned on the organic light emitting element OLED to cover the pixel PX. A layer between the substrate SUB and the thin film encapsulation layer TFE may be defined as the pixel layer PXL.

The first voltage ELVDD may be applied to the first electrode E1, and the second voltage ELVSS may be applied to the second electrode E2. A hole and an electron injected to the organic emission layer OEL may be combined to form an exciton, and the light emitting element OLED may emit light while the exciton is transitioned to the ground state. According to the flow of the current, the organic light emitting element OLED may display an image by emitting light of red, green and blue colors.

Figure 8:
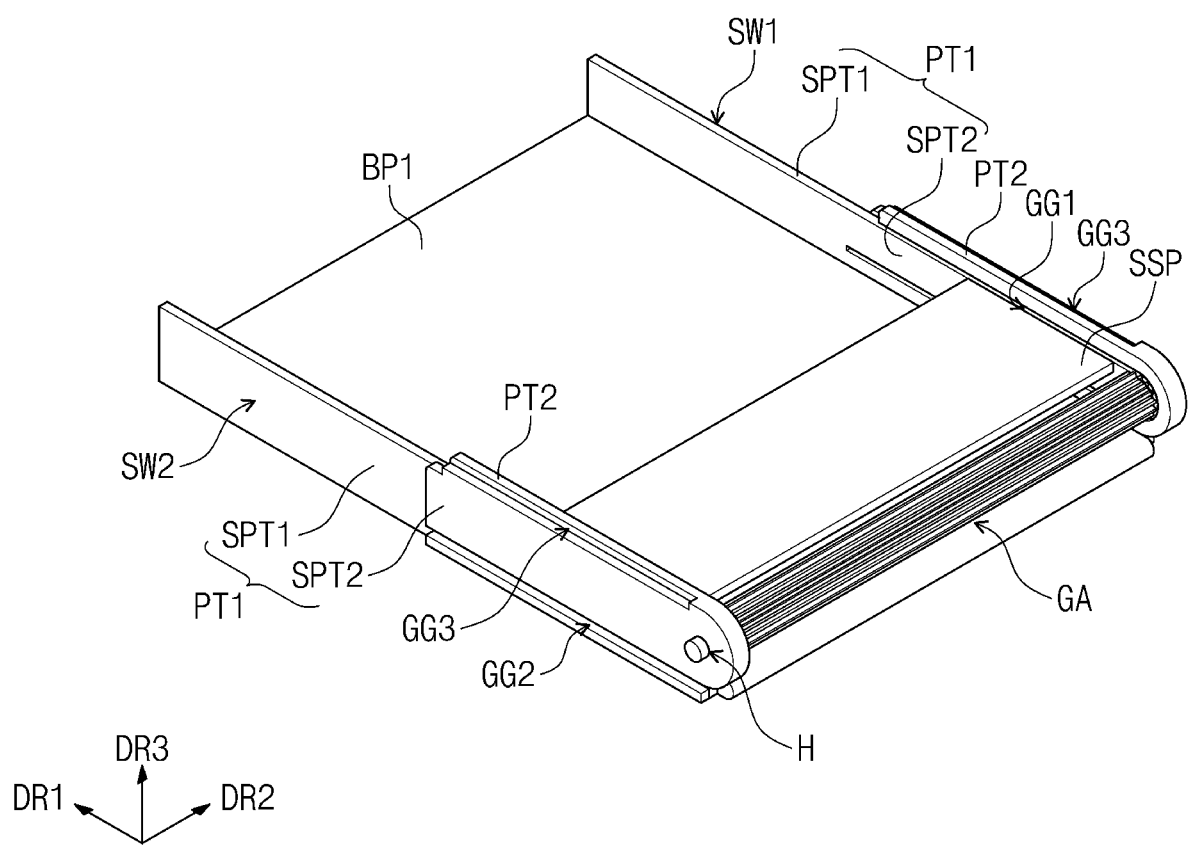
FIG. 8 illustrates a gear part positioned in a first case shown in FIG. 7.

FIG. 7 is an exploded perspective view of a case illustrated in FIG. 1. FIG. 8 illustrates a gear part positioned in a first case shown in FIG. 7.

In FIG. 8, a third sidewall SW3 is omitted so as to explain the gear part GA.

Referring to FIG. 7, a case CS may include a first case CS1, a second case CS2, a sub-support part SSP, and the gear part GA. The gear part GA may be positioned in the first case CS1, and this configuration will be described in more detail below with reference to FIG. 8.

The first case CS1 may include a first sidewall SW1, a second sidewall SW2, and the third sidewall SW3, and a first bottom part BP1. The first sidewall SW1 may have a plane defined by first and third directions DR1 and DR3, and may extend longer in the first direction DR1 than in the third direction DR3.

The second sidewall SW2 may have a plane defined by the first and third directions DR1 and DR3, and may extend longer in the first direction DR1 than in the third direction DR3. The second sidewall SW2 may face the first sidewall SW1 in the second direction DR2.

The first sidewall SW1 and the second sidewall SW2 may have substantially the same shape. One side of the first sidewall SW1 and one side of the second sidewall SW2 may respectively have curved shapes that are convex to the outside.

A first guide groove GG1 may be defined in each of the inner surfaces of the first sidewall SW1 and the second sidewall SW2, which face each other. The inner surfaces of the first sidewall SW1 and the second sidewall SW2 may define the inner surfaces of the first case CS1, which face each other in the second direction DR2.

The first guide groove GG1, which is defined in the inner surface of the first sidewall SW1 on an observation position of the perspective view, is illustrated in FIG. 7, but the first guide groove GG1 may also be defined in the inner surface of the second sidewall SW2. The first guide grooves GG1 may have a "U" shape rotated by 90 degrees. A specific shape of the first guide groove GG1 will be described in more detail below.

Hereinafter, the surface of the first sidewall SW1, which is opposite to the inner surface thereof, is defined as the outer surface of the first sidewall SW1. The surface of the second sidewall SW2, which is opposite to the inner surface thereof, is defined as the outer surface of the second sidewall SW2. In addition, the inner surfaces and the outer surfaces of subordinate components of the first and second sidewall surfaces SW1 and SW2 may correspond to the inner surfaces and the outer surfaces of the first and second sidewalls SW1 and SW2.

A second guide groove GG2, which extends in the first direction DR1, may be defined in each outer surface of the first and second sidewalls SW1 and SW2. A third guide groove GG3, which extends in the first direction DR1, may be defined in each top end of the first and second sidewalls SW1 and SW2. The second guide groove GG2 and the third guide groove GG3, which are defined in the second sidewall SW2 on an observation position of the perspective view, are illustrated, but the second guide groove GG2 and the third guide groove GG3 may also be defined in the first sidewall SW1.

Each of the first and second sidewalls SW1 and SW2 may include a first part PT1 and a second part PT2 that are positioned on a prescribed portion of the first part PT1, which is adjacent to one side of the first part PT1, and extend in the first direction DR1. The one side of the first part PT1 may correspond to the one side of each of the first and second sidewalls SW1 and SW2. A portion of the first guide groove GG1 may be positioned between the first part PT1 and the second part PT2.

The first part PT1 may include a first subpart SPT1 that does not overlap the second part PT2, and a second subpart SPT2 that overlaps the second part PT2. The second subpart SPT2 may be positioned under the second part PT2.

The inner surface of the first subpart SPT1 and the inner surface of the second subpart SPT2 may be positioned on the same plane. The outer surface of the second subpart SPT2 may be positioned outer than the outer surface of the first subpart SPT1. In other words, on the basis of the second direction DR2, the thickness of the second subpart SPT2 may be thicker than that of the first subpart SPT1.

The second guide grooves GG2 may be defined in the outer surfaces of the second subparts SPT2. The second guide grooves GG2 may be adjacent to the bottom end of the second subpart SPT2. The third guide grooves GG3 may be defined in the top ends of the second part PT2. The third guide grooves GG3 may be defined in the top ends of the second part PT2, which are adjacent to the outer surfaces of the second part PT2.

The third sidewall SW3 may be positioned between the one side of the first sidewall SW1 and the one side of the second sidewall SW2. The third sidewall SW3 may define one side of the first case CS1 between both sides of the first case CS1, which are opposite to each other in the first direction DR1. The second part PT2 and the second subpart SPT2 may be adjacent to the third sidewall SW3.

The first bottom part BP1 may have a plane defined by the first and second directions DR1 and DR2. The first bottom part BP1 may be connected to the bottom ends of the first, second, and third sidewalls SW1, SW2, and SW3.

The sub-support part SSP may have a plane defined by the first and second directions DR1 and DR2. The sub-support part SSP may extend longer in the second direction DR2 than in the first direction DR1. The sub-support part SSP may be positioned between the first sidewall SW1 and the second sidewall SW2. The sub-support part SSP may be adjacent to the third sidewall SW3.

The second case CS2 may include a first outer sidewall OSW1, a second outer sidewall OSW2, a third outer sidewall OSW3, and a second bottom part BP2. The first outer sidewall OSW1 may have a plane defined by the first and third directions DR1 and DR3, and extend longer in the first direction DR1 than in the third direction DR3.

The second outer sidewall OSW2 may have a plane defined by the first and third directions DR1 and DR3, and extends longer in the first direction DR1 than in the third direction DR3. The second outer sidewall OSW2 may face the first outer sidewall OSW1 in the second direction DR2. The first outer sidewall OSW1 and the second outer sidewall OSW2 may have substantially the same shape.

The second case CS2 may include first protruding parts P1 that respectively protrude from the inner surfaces of the first outer sidewall OSW1 and the second outer sidewall OSW2 and extend in the first direction DR1. The first protruding parts P1 may respectively extend in the first direction DR1 from one sides of the first and second outer sidewalls OSW1 and OSW2.

The first protruding part P1, which is positioned in the inner surface of the first outer sidewall OSW1 on an observation position of the perspective view, is illustrated in FIG.

7, but, substantially, the first protruding part P1 may also be positioned in the inner surface of the second outer sidewall OSW2. The first protruding parts P1 may be respectively adjacent to the bottom ends of the first and second outer sidewalls OSW1 and OSW2. Substantially, the first protruding parts P1 may be positioned so as to correspond to the positions at which the second guide grooves GG2 are positioned.

When the first and second cases CS1 and CS2 are combined to each other, the one sides of the first and second outer sidewalls OSW1 and OSW2 may be substantially defined as the terminal ends of the first and second outer sidewalls OSW1 and OSW2, which are adjacent to the one sides of the first and second sidewalls SW1 and SW2. Hereinafter, opposite sides to the one sides of the first and second outer sidewalls OSW1 and OSW2 may be defined as the other sides of the first and second outer sidewalls OSW1 and OSW2.

The second case CS2 may include second protruding parts P2 that respectively protrude from the top ends of the first outer sidewall OSW1 and the second outer sidewall OSW2 and extend in the first direction DR1. The second protruding parts P2 may respectively extend in the first direction DR1 from the one sides of the first and second outer sidewalls OSW1 and OSW2.

The second protruding part P2, which protrudes from the first outer sidewall OSW1 on an observation position of the perspective view, is illustrated in FIG. 7, but, substantially, the second protruding part P2 may also protrude from the second outer sidewall OSW2. The second protruding parts P2 may be positioned to correspond to the positions at which the third guide grooves GG3 are respectively positioned.

A connection groove CG may be defined in each of the inner surfaces of the first outer sidewall OSW1 and the second outer sidewall OSW2. The connection grooves CG may be adjacent to the other sides of the first and second outer sidewalls OSW1 and OSW2. The connection guide groove CG, which is defined in the inner surface of the first outer sidewall OSW1 on an observation position of the perspective view, is illustrated in FIG. 7, but the connection CG may also be defined in the inner surface of the second outer sidewall OSW2. The inner surfaces of the first outer sidewall and the second outer sidewall OSW1 and OSW2 may define the inner surfaces of the second case CS2, which face each other in the second direction DR2.

The third outer sidewall OSW3 may face the third sidewall SW3, and may be positioned between the first outer sidewall OSW1 and the second outer sidewall OSW2. The third outer sidewall OSW3 may be positioned between the other side of the first outer sidewall OSW1 and the other side of the second outer sidewall OSW2.

The second bottom part BP2 may have a plane defined by the first and second regions DR1 and DR2. The second bottom part BP2 may be connected to the bottom ends of the first, second, and third outer sidewalls OSW1, OSW2, and OSW3.

The gear part GA may extend in the second direction DR2. The gear part GA may have a gear shape. For example, the gear part GA may include a plurality of teeth that extend in the second direction DR2 and are arrayed along the circumferential surface of a cylindrical shape. The gear part GA may rotate around the central axis of the gear part GA extending in the second direction DR2.

Referring to FIGS. 7 and 8, the gear part GA may be positioned in the first case CS1. The gear part GA may be positioned between the first sidewall SW1 and the second sidewall SW2. The gear part GA may be adjacent to the one sides (or the third sidewall SW3) of the first and second outer sidewalls SW1 and SW2.

The gear part GA may be connected to the first case CS1. For example, both ends of the gear part GA, which are opposite to each other in the second direction DR2, may be respectively inserted into holes H defined in parts of the first and second sidewalls SW1 and SW2, which are adjacent to the one sides of the first and second sidewalls SW1 and SW2.

Figure 9:
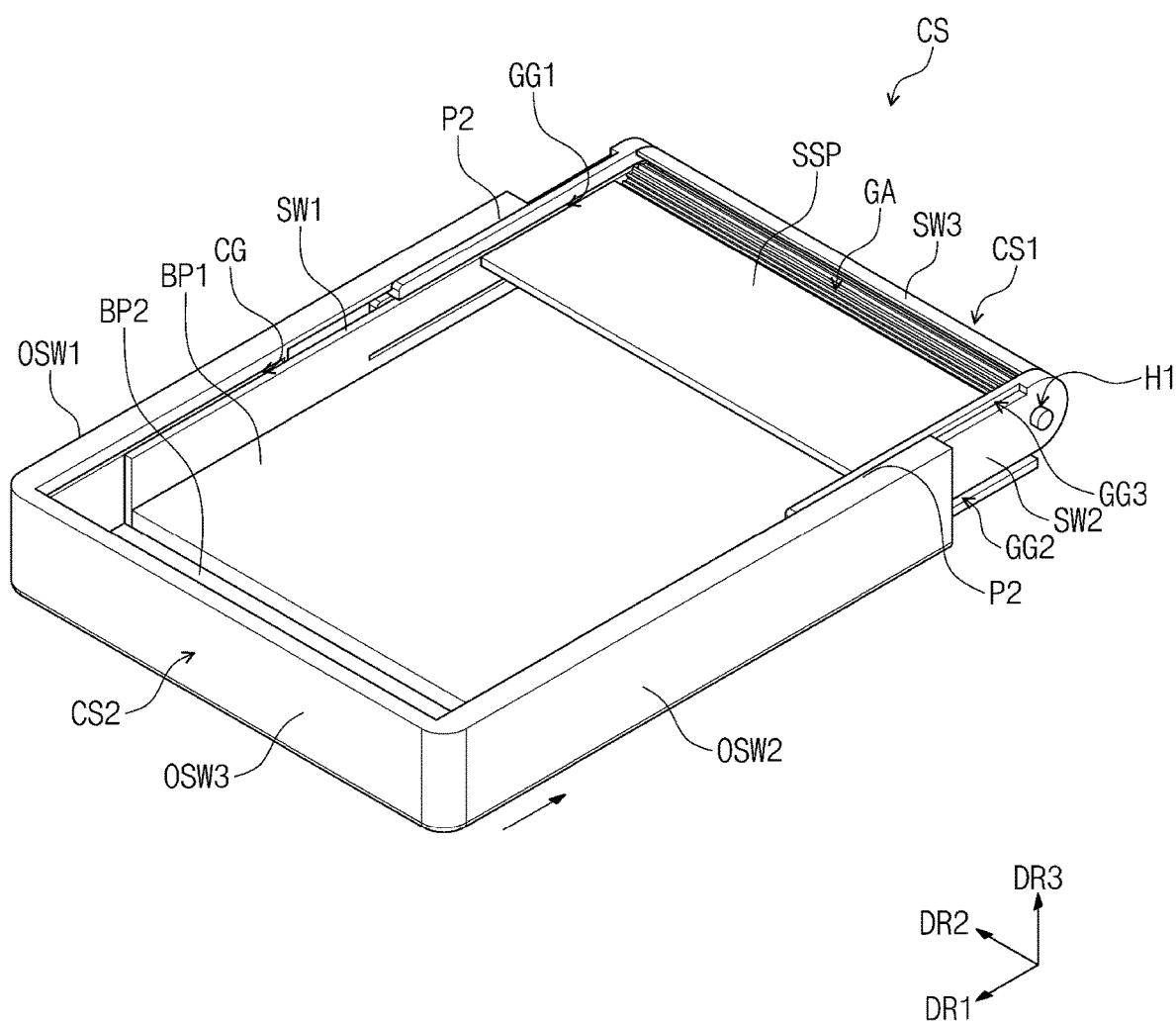
FIGS. 9 and 10 illustrate a state in which a second case illustrated in FIG. 7 is combined to the first case.
Figure 10:
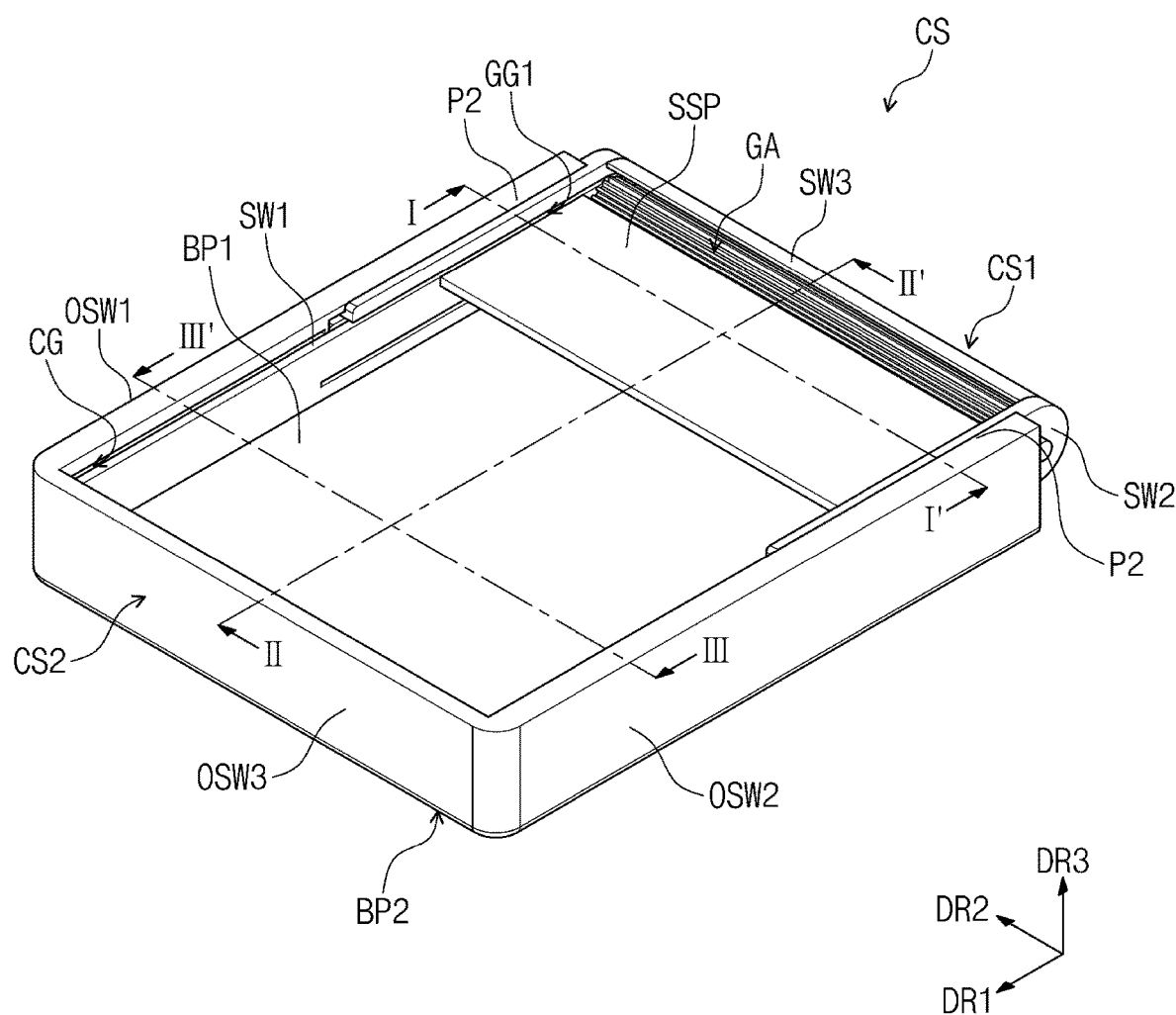

FIGS. 9 and 10 illustrate a state in which the second case illustrated in FIG. 7 is combined to the first case.

Referring to FIGS. 9 and 10, the second case CS2 may be inserted into the second and third guide grooves GG2 and GG3 to be combined to the first case CS1. For example, the first protruding parts P1 may be inserted into the second guide grooves GG2, and the second protruding parts P2 may be inserted into the third guide grooves GG3 to cause the second case CS2 to be combined to the first case CS1. Such a configuration will be described in more detail with reference to FIG. 11.

The first outer sidewall OSW1 may be positioned on the outer surface of the first outer sidewall SW1, and the second outer sidewall OSW2 may be positioned on the outer surface of the second sidewall SW2. The first bottom part BP1 may be positioned under the second bottom part BP2.

When the second case CS2 is combined to the first case CS1, the one sides of the first and second outer sidewalls OSW1 and OSW2 may be adjacent to the one sides of the first and second sidewalls SW1 and SW2, and the other sides of the first and second outer sidewalls OSW1 and OSW2 may be adjacent to the other sides of the first and second sidewalls SW1 and SW2. The third outer sidewall OSW3 may be adjacent to the other sides of the first and second sidewalls SW1 and SW2.

The one side of the second case CS2 may be adjacent to the one side of the first case CS1, and the other side of the second case CS2, which is the opposite side of the one side of the second case CS2, may be adjacent to the other side of the first case CS1. The other side of the second case CS2 may be defined by the third outer sidewall OSW3.

Figure 11:
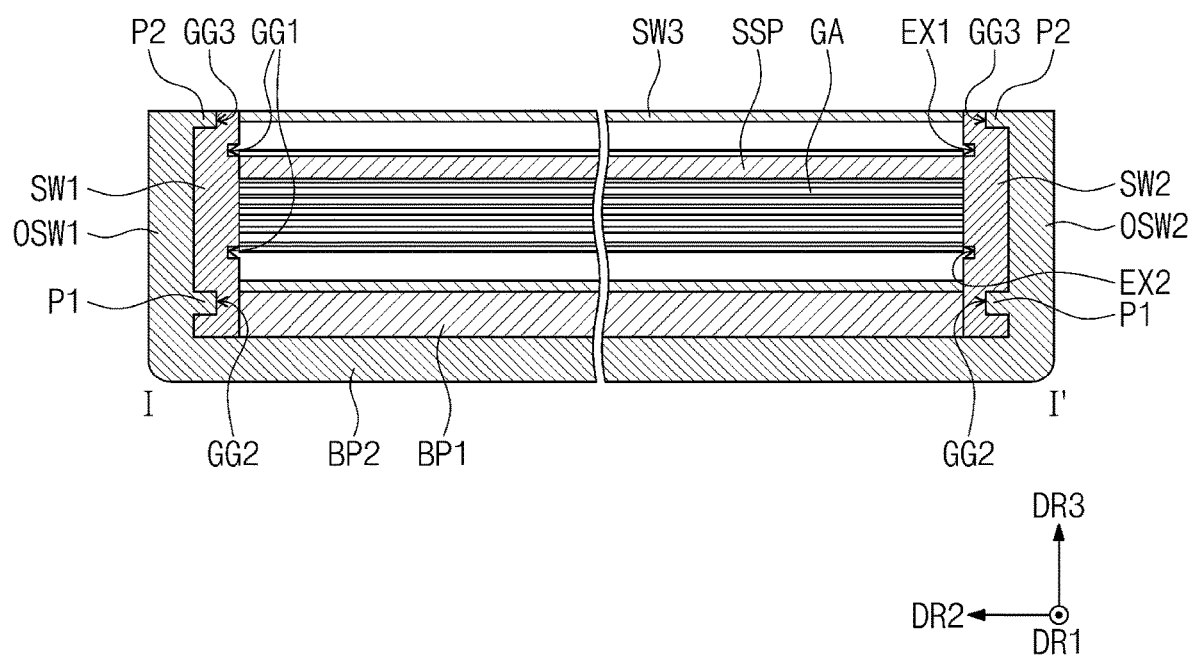
FIG. 11 is a cross-sectional view cut along the line I-I' shown in FIG. 10.
Figure 12:
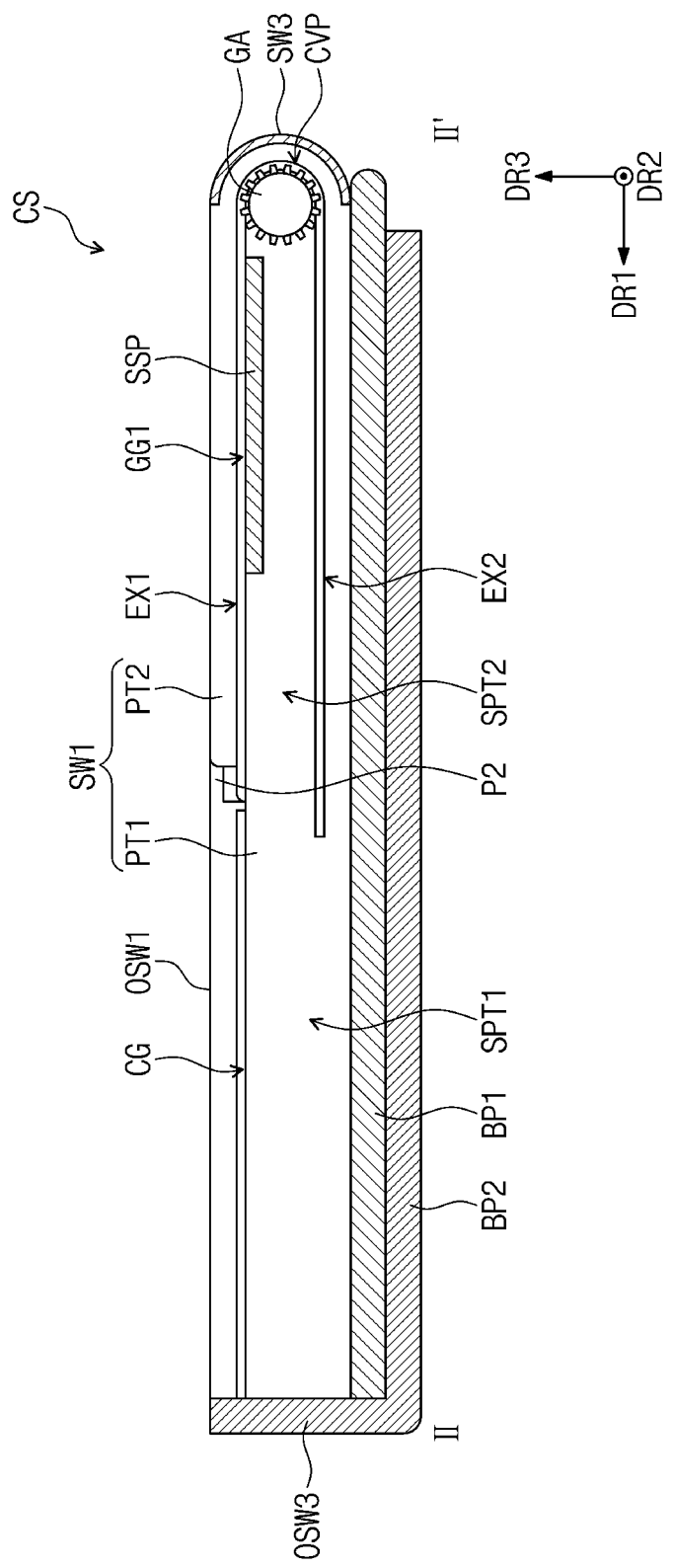
FIG. 12 is a cross-sectional view cut along the line II-II' illustrated in FIG. 10.
Figure 13:
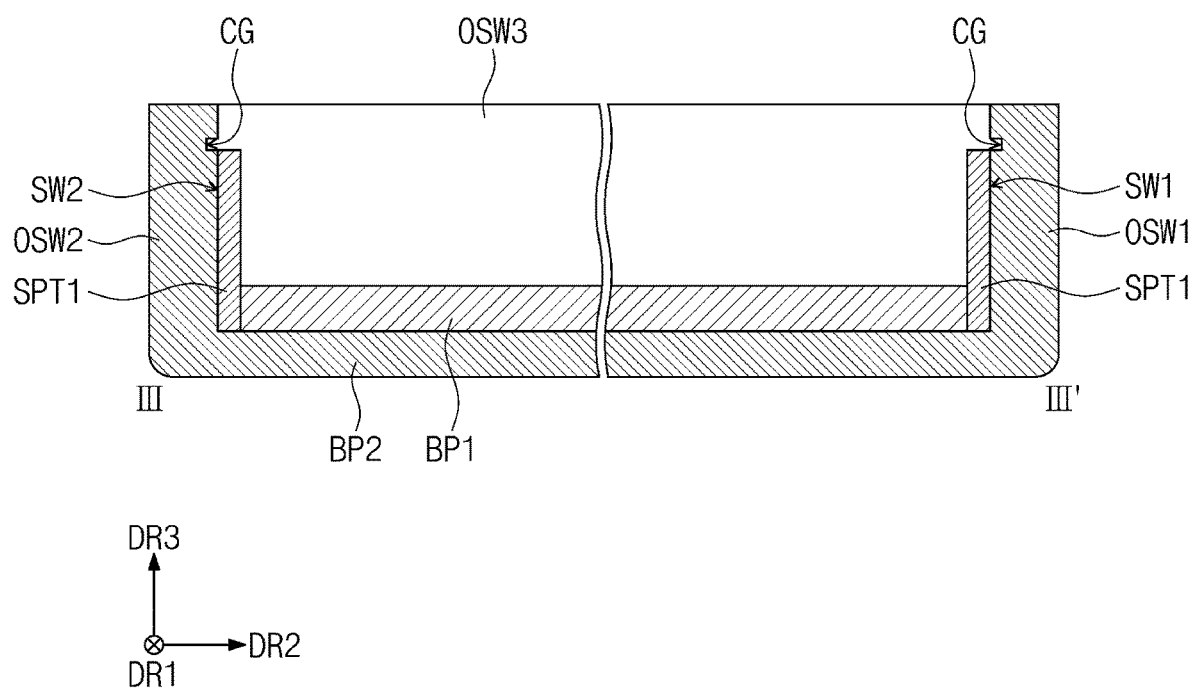
FIG. 13 is a cross-sectional view cut along the line III-III' shown in FIG. 10.

FIG. 11 is a cross-sectional view from the line I-I' shown in FIG. 10. FIG. 12 is a cross-sectional view cut along the line II-II' illustrated in FIG. 10. FIG. 13 is a cross-sectional view cut along the line III-III' shown in FIG. 10.

Referring to FIG. 11, the inner surface of the first outer sidewall OSW1 may be one surface of the first outer sidewall OSW1, which faces the outer surface of the first sidewall SW1. The inner surface of the second outer sidewall OSW2 may be one surface of the second outer sidewall OSW2, which faces the outer surface of the second outer sidewall SW2.

The first protruding parts P1 may respectively protrude from the inner surfaces of the first and second outer sidewalls OSW1 and OSW2 toward the first and second sidewalls SW1 and SW2. The first protruding parts P1 may be respectively adjacent to the bottom ends of the first and second outer sidewalls OSW1 and OSW2. The first protruding parts P1 may be respectively inserted into the second guide grooves GG2.

The second protruding parts P2 may respectively protrude from the top ends of the first and second outer sidewalls OSW1 and OSW2 toward the first and second sidewalls SW1 and SW2. The second protruding parts P2 may be respectively inserted into the third guide grooves GG3.

Referring to FIG. 12, the third sidewall SW3 may have a convexly curved shape toward the outside. The inner surface of the third sidewall SW3, which faces the third outer sidewall OSW3, may have a concavely curved shape. The outer surface of the third sidewall SW3, which is an opposite surface to the inner surface of the third sidewall SW3, may have a convexly curved shape toward the outside.

The first guide grooves GG1 may be further adjacent to the one side of the first sidewall SW1 (or the second sidewall SW2) than the other side of the first sidewall SW1 (or the second sidewall SW3). The first guide groove GG1 may include a first extension part EX1, a second extension part EX2, and a curved part CVP. The first extension part EX1 may extend in the first direction DR1. The second extension part EX2 may extend in the first direction DR1 and be positioned under the first extension part EX1.

An example of the length of the second extension part EX2 being longer than that of the first extension part EX1 in the first direction DR1 is illustrated, but the relationship between the length of the second extension part EX2 and the length of the first extension part EX1 is not limited thereto.

The curved part CVP may extend in a curved shape from one side of the first extension part EX1 to one side of the second extension part EX2. The one side of the first extension part EX1 and the one side of the second extension part EX2 may be adjacent to the one side (or the third sidewall SW3) of the first case CS1. The curved part CVP may have a convexly curved shape toward the one side (or the third sidewall SW3) of the first case CS1.

The sub-support part SSP may be positioned between the first extension part EX1 and the second extension part EX2. The sub-support part SSP may be adjacent to the first extension part EX1. The sub-support part SSP may be adjacent to the curved part CVP.

The gear part GA may be positioned between the first extension part EX1 and the second extension part EX2. The gear part GA may be adjacent to the curved part CVP. The gear part GA may be positioned between the sub-support part SSP and the curved part CVP.

Referring to FIGS. 12 and 13, the heights of the top ends of the first and second outer sidewalls OSW1 and OSW2 may be higher than those of the first sub-parts SPT1. The connection grooves CG may be defined in the first and second outer sidewalls OSW1 and OSW2. When viewed in the second direction DR2, each of the connection grooves CG does not overlap the first extension part EX1, and may be substantially aligned with the first extension part EX1.

The connection grooves CG may be defined in the first and second outer sidewalls OSW1 and OSW2 that do not overlap the first extension parts EX1. For example, the connection grooves CG may be defined in parts of the first and second outer sidewalls OSW1 and OSW2, which are positioned higher than the first sub-parts SPT1. The connection grooves CG may be adjacent to the other side (or the third outer sidewall OSW3) of the second case CS2.

Figure 14:
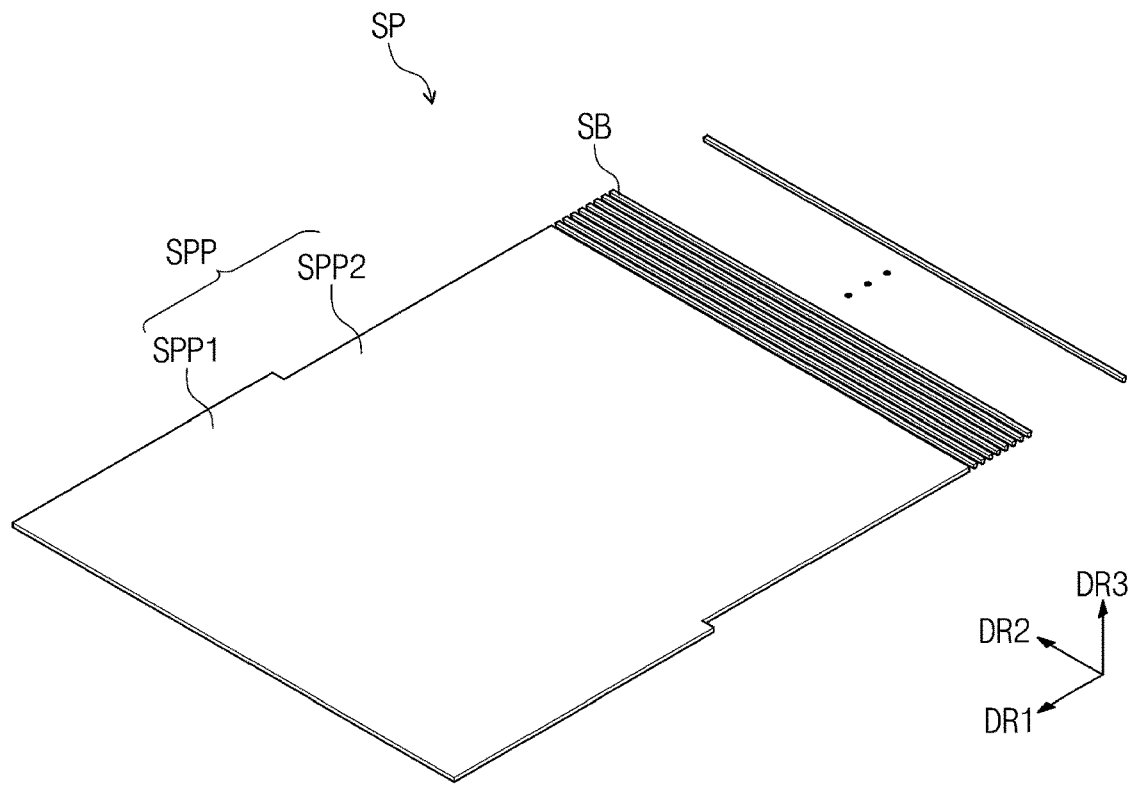
FIG. 14 illustrates a support part to be positioned in the first case shown in FIG. 7.
Figure 15:
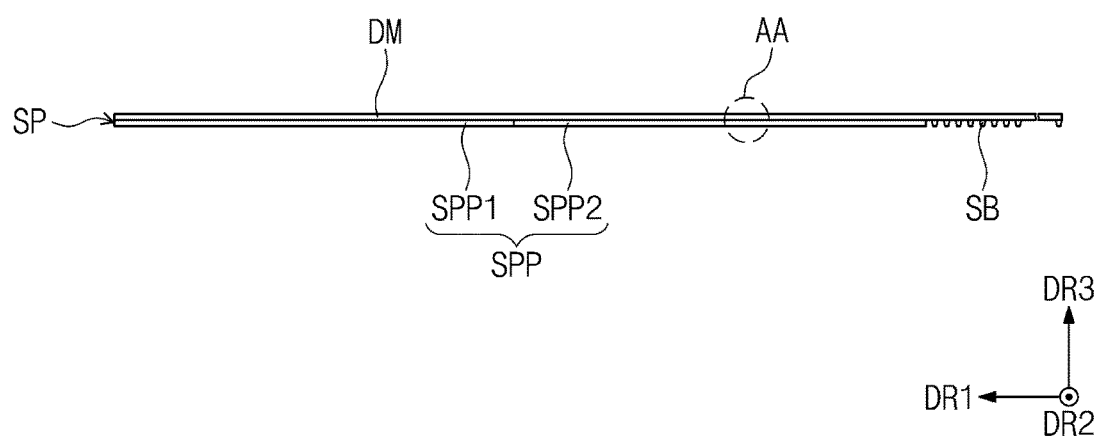
FIG. 15 illustrates a display module positioned on the support part.
Figure 16:
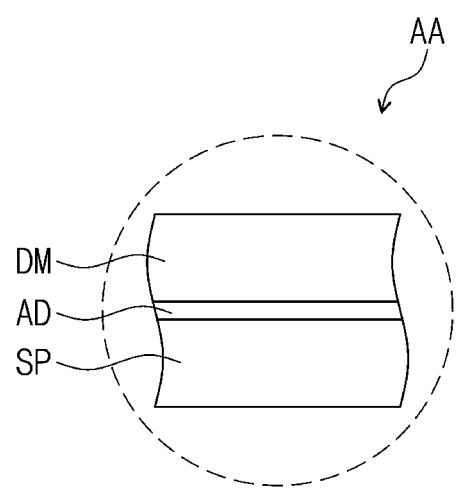
FIG. 16 is an enlarged view of a first area AA illustrated in FIG. 15.

FIG. 14 illustrates a support part to be positioned in the first case shown in FIG. 7. FIG. 15 illustrates a display module positioned on the support part. FIG. 16 is an enlarged view of the first area AA illustrated in FIG. 15.

For convenience of explanation, FIG. 15 illustrates the support part SP and a side surface of the display module DM viewed in the second direction DR2.

Referring to FIGS. 14 and 15, the display device DD may include the support part SP, and the support part SP may include a support plate SPP and a plurality of support bars SB separated from the support plate SPP. The support part SSP may have a plane defined by the first and second directions DR1 and DR2. The support plate SPP and the support bars SB may be arrayed in the first direction DR1.

The support bars SB may extend in the second direction DR2, and be arrayed in the first direction DR1. The support bars SB may be separated from each other by an interval (e.g., a prescribed interval or predetermined) in the first direction DR1. The support bars SB may have an inverse trapezoidal shape, when viewed in the second direction DR2.

An example of the support bars SB being separated from each other is illustrated, but the structure of the support bars SB is not limited thereto. For example, the support bars SB may be implemented in a joint structure in which the support bars SB are combined to rotate around each other.

The support plate SPP may include a first support plate SPP1 and a second support plate SPP2. The second support plate SPP2 may be positioned between the first support plate SPP1 and the support bars SB. On the basis of the second direction DR2, the first support plate SPP1 may have a longer length than the second support plate SPP2.

Referring to FIGS. 15 and 16, the support part SP may be positioned in the rear surface of the display module DM, which is an opposite surface of the front surface of the display model DM. The adhesive AD may be positioned between the display module DM and the support part SP, and the support part SP may be attached to the display module DM with the adhesive AD. The adhesive AD may include a pressure sensitive adhesive, but include various other adhesives without being limited thereto.

Figure 17:
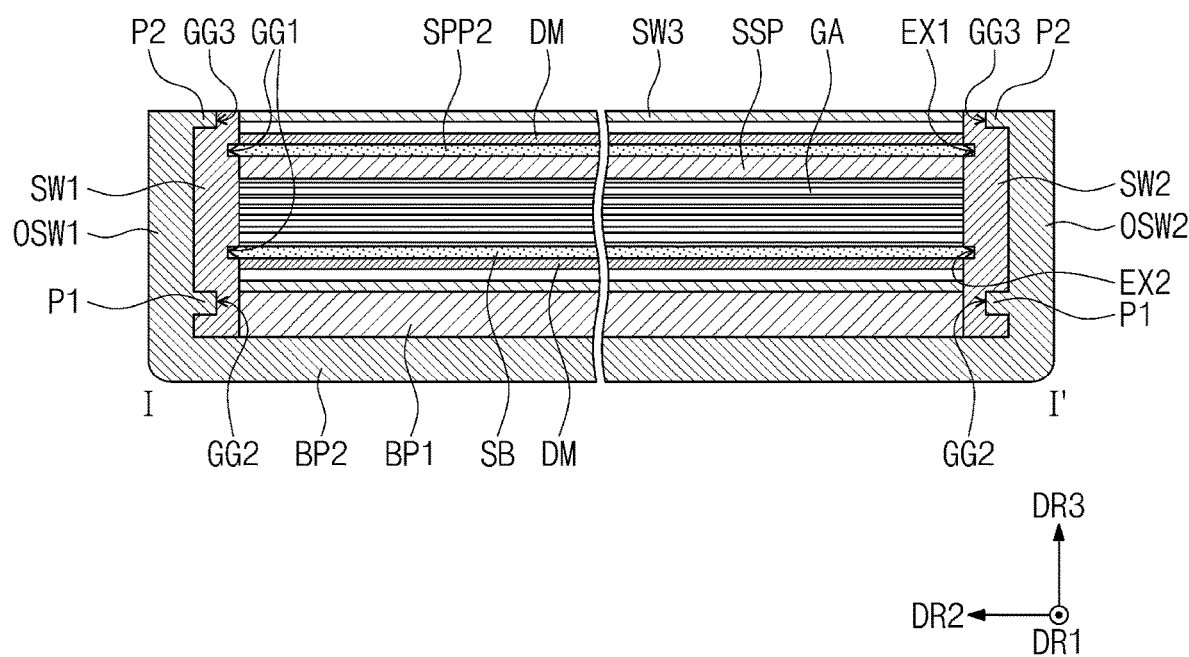
FIGS. 17, 18, and 19 illustrate the support part and a display module positioned in the first and second cases.
Figure 18:
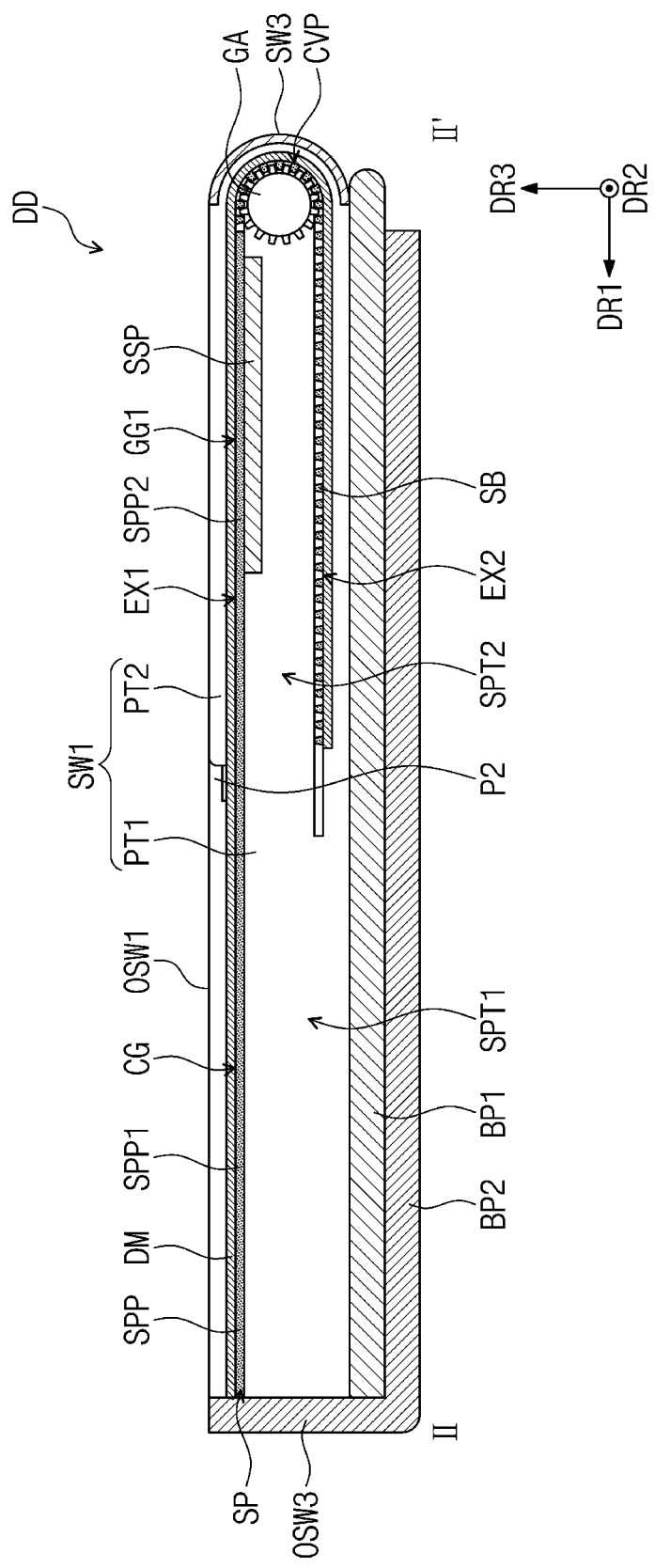
Figure 19:
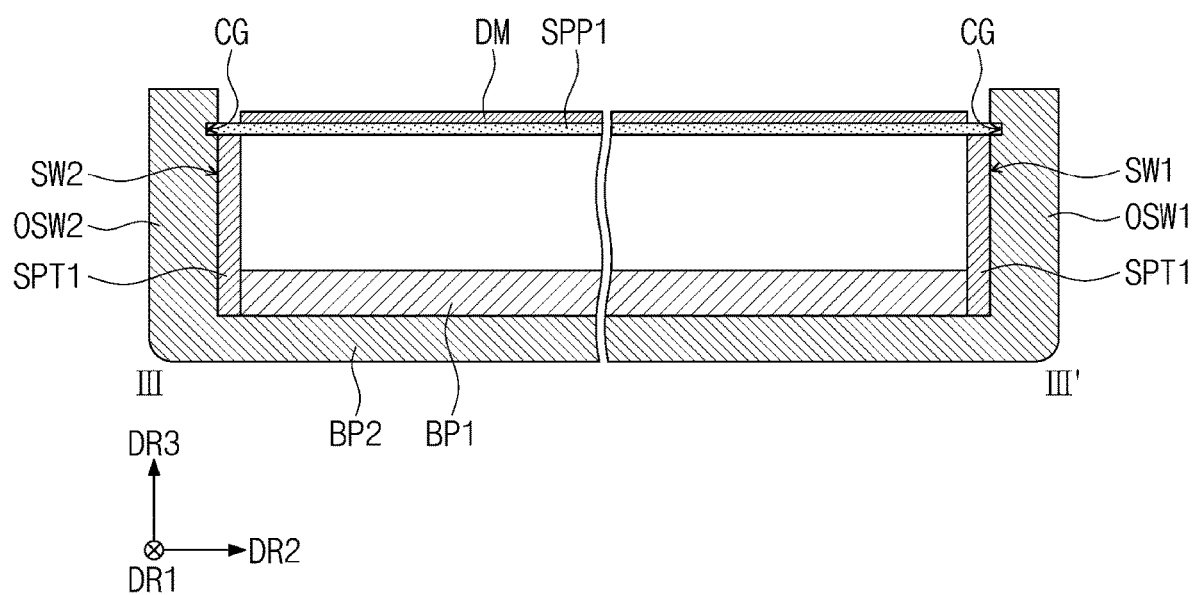
Figure 20:
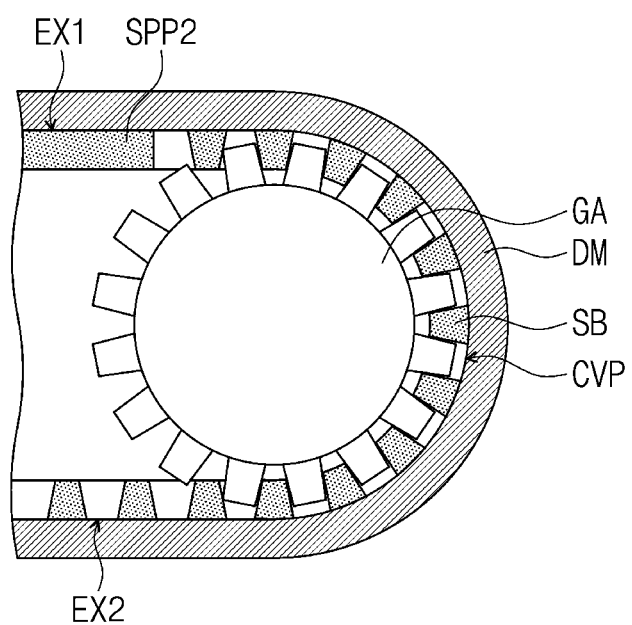
FIG. 20 is an enlarged view of support bars and a gear part positioned in a curved part illustrated in FIG. 18.

FIGS. 17, 18, and 19 illustrate the support part and the display module positioned in the first and second cases. FIG. 20 is an enlarged view of the support bars and the gear part positioned in the curved part illustrated in FIG. 18.

FIG. 17 is a cross-sectional view substantially corresponding to FIG. 11, and FIG. 18 is a cross-sectional view substantially corresponding to FIG. 12, and FIG. 19 is a cross-sectional view substantially corresponding to FIG. 13.

Referring to FIGS. 17, 18 and 19, when viewed in the second direction DR2, the support plate SPP and the support bars SB may be positioned in the rear surface of the display module DM, which is an opposite surface of the front surface of the display module EM adjacent to the edge of the first case CS1. The support plate SP may be connected to the second case CS2, and both sides of the support part SP, which are opposite to each other in the second direction DR2, are respectively inserted into the first guide grooves GG1 to be moved in the first direction DR1.

For example, the support plate SPP may be connected to the second case CS2. For example, as illustrated in FIG. 19, both sides of the first support plate SPP1, which are opposite to each other in the second direction DR2, are respectively inserted into the connection grooves CG to be connected to the second case CS2. Prescribed parts of the first support plate SPP1, which are adjacent to both sides of the first support plate SPP1, may be positioned on the first sub-parts SPT1 of the first and second sidewalls SW1 and SW2.

A state of the display device DD illustrated in FIG. 18 may be a fundamental mode of the display device DD, in which the second case CS2 is moved in a direction close to the first case CS1 along the first direction DR1.

In the fundamental mode of the display device DD, the both sides of the support plate SPP may be positioned in the first extension parts EX1. For example, as illustrated in FIG. 17, both sides of the second support plate SPP2, which are opposite to each other in the second direction DR2, are respectively inserted and positioned into the first extension parts EX1. In the fundamental mode of the display device DD, both sides of the support bars SB, which are opposite to each other in the second direction DR2, may be respectively inserted and positioned into the second extension part EX2 and the curved part CVP.

According to the position of the aforementioned support part SP, the display module DM may be accommodated in the first and second cases CS1 and CS2 in a state of being folded along the curved part CVP. For example, a part of the display module DM on the support bars SB positioned in the curved part CVP may be folded. The part of the display module DM positioned on the support plate SPP may be exposed to the outside by the opening part OP illustrated in FIG. 1, and a part of the display module DM positioned on the support bars SB may not be exposed to the outside.

The sub-support part SSP may overlap a part of the support part SP to be positioned under the support part SP. For example, the sub-support part SSP may overlap the second support plate SPP2, which is a part of the support plate SPP, to be positioned under the second support plate SPP2.

Referring to FIGS. 18 and 20, the gear part GA may be rotated to move the support bars SB positioned in the curved part CVP. For example, the teeth of the gear part GA may be positioned between the support bars SB positioned in the curved part CVP. According to the rotation of the gear part GA, the teeth may push the support bars SB, and thus the support bars SB may be more easily moved.

Figure 21:
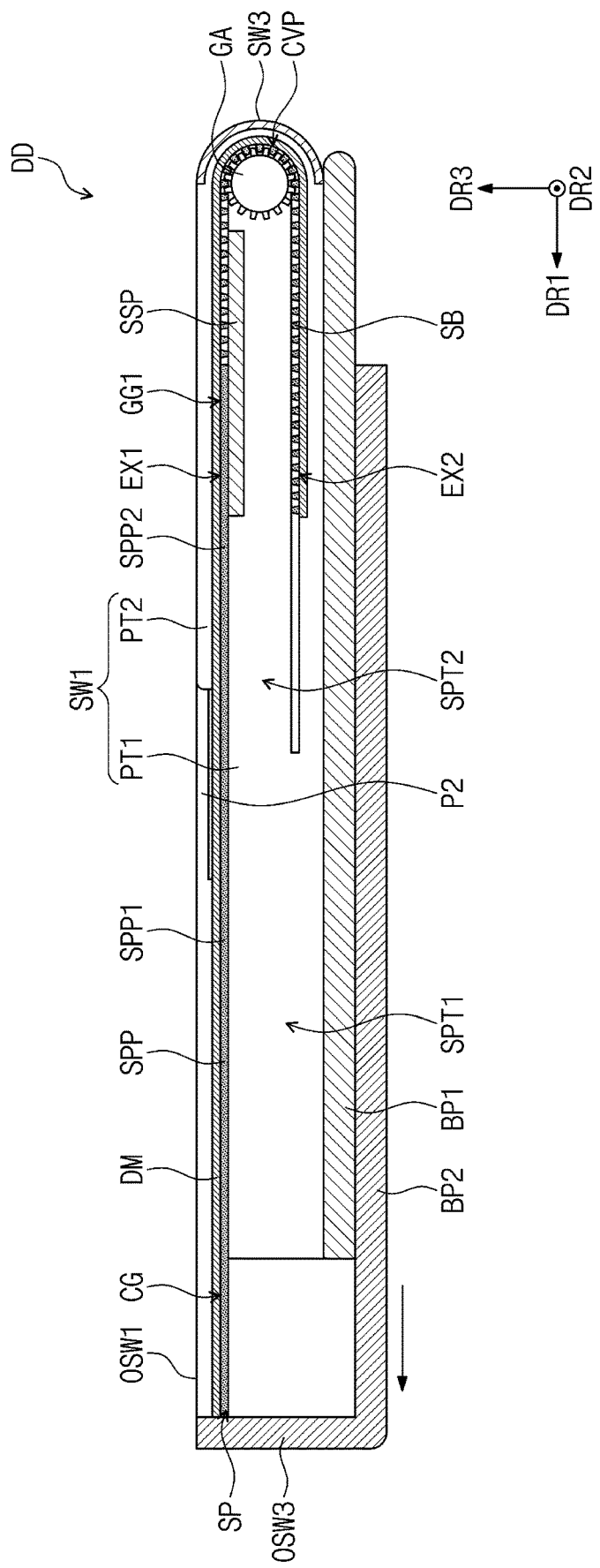
FIG. 21 illustrates an extension mode of the display device illustrated in FIG. 18.

FIG. 21 illustrates an extension mode of the display device illustrated in FIG. 18.

Referring to FIG. 21, for the extension mode of the display device DD, when the second case CS2 is moved away from the first case CS1 in the first direction DR1, the support part SP may be moved along the first guide grooves GG1. For example, the first support plate SPP1 is connected to the second case CS2 to be moved in the first direction DR1 along the second case CS2, and the second support plate SPP2 and the support bars SB may be moved along the first guide grooves GG1. The gear part GA may be rotated to move the support bars SB along the first guide grooves GG1.

The second case CS2 may be moved in various ways. For example, the second case CS2 may be moved by a driving part that rotates the gear part GA. The gear part GA may be rotated in a clockwise direction or a counterclockwise direction by the driving part, and the support bars SB may be moved by the gear part GA.

When the gear part GA is rotated in the counterclockwise direction, the second case CS2 may be moved in the first direction DR1 while the support plate SPP is moved in the first direction DR1 according to the movement of the support bars SB. In this case, as illustrated in FIG. 2, the extension mode of the display device DD may be implemented. On the contrary, when the gear part GA is rotated in the clockwise direction by the driving part, the fundamental mode of the display device DD may be implemented as illustrated in FIG. 1.

According to a rotation amount of the gear part GA, a movement amount of the second case CS2 may be determined. Accordingly, an extending area of the display module DM may be determined according to the rotation amount of the gear part GA. The rotation amount of the gear part GA may be selectively adjusted by the user operating the driving part. However, the embodiments of the inventive concept are not limited thereto, and the second case CS2 may be moved by an external force from the user.

In the extension mode, a part of the support bars SB may be moved along the curve part CVP to be positioned in parts of the first extension parts EX1. The sub-support part SSP may be positioned under the support bars SB positioned in the parts of the first extension parts EX1. Accordingly, in the extension mode, the support bars SB having moved to the first extension parts EX1 may be positioned on the sub-support part SSP.

When the sub-support part SPP is not positioned in the first case CS1, the support bars SB having moved to the first extension parts EX1 may be drooped lower and modified by an external force between the first sidewall SW1 and the second sidewall SW2.

However, according to some example embodiments of the inventive concept, because the support bars SB having moved to the first extension parts EX1 are positioned on the sub-support part SSP in the extension mode of the display device DD, the sub support part SPP may support the support bars SB having moved to the first extension parts EX1. Because the sub-support part SSP supports the support bars SB having moved to the first extension parts EX1, modification of the support bars SB due to the external force may be prevented.

Consequently, the display device DD according to some example embodiments of the inventive concept may prevent the support bars SB from being modified.

According to some example embodiments of the inventive concept, in the extension mode of the display device in which an exposed surface of the display module extends, the sub-support part is positioned under the support bars, which support the display module, to support the support bars, and thus modification of the support bars by an external force may be prevented.

Although aspects of some example embodiments of the present disclosure have been described, it is understood that the present disclosure should not be limited to these example embodiments but various changes and modifications can be made by one ordinary skilled in the art within the spirit and scope of the present disclosure as hereinafter claimed. In addition, embodiments disclosed in the present disclosure are not intended to limit the technical spirit of the present disclosure, and the protection scope of the present disclosure should be interpreted based on the following appended claims, and their equivalents, and it should be appreciated that all technical spirits included within a range equivalent thereto are included in the protection scope of the inventive concept.

What is claimed is:

1. A display device comprising:
 a display module;
 a support part comprising a support plate and a plurality of support bars disposed under a rear surface of the display module;
 a first case accommodating the display module and the support part;
 a second case combined with the first case so as to be moved in a direction away from or close to the first case along a first direction; and
 a sub-support part under the support part so as to overlap a part of the support part,
 wherein both sides of the plurality of support bars are respectively inserted into first guide grooves defined in inner surfaces of the first case, which face with each other in a second direction crossing the first direction, and the plurality of support bars are configured to be moved along the first guide grooves,
 wherein the plurality of support bars extends in the second direction, and
 wherein when the second case is moved in a direction away from the first case, some support bars of the plurality of support bars are disposed on an upper surface of the sub-support part facing the display module.

2. The display device of claim 1, wherein the sub-support part is adjacent to one of both sides of the first case, which are opposite to each other in the first direction.

3. The display device of claim 1, wherein each of the first guide grooves comprises:
a first extension part extending in the first direction;
a second extension part extending in the first direction and positioned under the first extension part; and
a curved part extending from one side of the first extension part to one side of the second extension part,
wherein the one side of each of the first and second extension parts is adjacent to the one side of the first case, and the curved part has a convexly curved shape toward the one side of the first case.

4. The display device of claim 3, wherein the sub-support part is between the first extension part and the second extension part.

5. The display device of claim 3, wherein the sub-support part is adjacent to the first extension part and the curved part.

6. The display device of claim 3, wherein the support plate is connected to the second case,
both sides of the support plate are configured to be inserted respectively into the first extension parts, when the second case is moved in a direction close to the first case, and
the both sides of the plurality of support bars are configured to be inserted into the curved parts and the second extension parts.

7. The display device of claim 6, wherein the plurality of support bars extend in the second direction, and are separated from each other to be arrayed in the first direction.

8. The display device of claim 6, wherein the second case is moved in the first direction, a part of the plurality of support bars are moved along the curved parts to be in a portion of the first extension parts, which is adjacent to the curved parts, and
the sub-support part is under the support bars in the portion of the first extension parts, which is adjacent to the curved parts.

9. The display device of claim 6, further comprising:
a gear part in the first case, extending in the second direction, and between the first extension parts and the second extension parts to be adjacent to the curved parts,
wherein teeth of the gear part are between support bars in the curved parts among the plurality of support bars.

10. The display device of claim 9, wherein the gear part is configured to be rotated to move the support bars in the curved parts.

11. The display device of claim 9, wherein the gear part is between the sub-support part and the curved parts.

12. The display device of claim 6, wherein the support plate comprises:
a first support plate connected to the second case; and
a second support plate between the first support plate and the plurality of support bars,
wherein both sides of the second support plate are inserted into the first extension parts.

13. The display device of claim 12, wherein the first support plate has a longer length than the second support plate on a basis of the second direction.

14. The display device of claim 12, wherein both sides of the first support plate are respectively inserted into connection grooves defined in inner surfaces of the second case, which face each other in the second direction, and the connection grooves do not overlap the first extension parts, when viewed in the second direction.

15. The display device of claim 3, wherein the first case comprises:
a first sidewall extending in the first direction;
a second sidewall extending in the first direction and facing the first sidewall in the second direction;
a third sidewall between one side of the first sidewall and one side of the second sidewall, and defining the one side of the first case; and
a first bottom part connected to bottom ends of the first, second, and third sidewalls.

16. The display device of claim 15, wherein the first guide grooves are respectively defined in inner surfaces of the first sidewall and the second sidewall, which face each other, and the sub-support part is between the first and second sidewalls and adjacent to the third sidewall.

17. The display device of claim 15, wherein the second case comprises:
a first outer sidewall on an outer surface of the first sidewall;
a second outer sidewall on an outer surface of the second sidewall;
a third outer sidewall facing the third sidewall, and between the first outer sidewall and the second sidewall; and
a second bottom part under the first bottom part.

18. The display device of claim 17, wherein the second case further comprises first protruding parts respectively protruding from inner surfaces of the first outer sidewall and the second outer sidewall to extend in the first direction,
wherein the first protruding parts are inserted into second guide grooves respectively defined in outer surfaces of the first sidewall and the second sidewall to extend in the first direction.

19. The display device of claim 17, wherein the second case further comprises second protruding parts respectively protruding from top ends of the first outer sidewall and the second outer sidewall toward the first sidewall and the second sidewall and extending in the first direction,
wherein the second protruding parts are inserted into third guide grooves respectively defined in top ends of the first sidewall and the second sidewall to extend in the first direction.

* * * * *